(12) United States Patent
Yamazaki et al.

(10) Patent No.: US 11,688,810 B2
(45) Date of Patent: Jun. 27, 2023

(54) OXIDE MATERIAL AND SEMICONDUCTOR DEVICE

(71) Applicant: Semiconductor Energy Laboratory Co., Ltd., Atsugi (JP)

(72) Inventors: Shunpei Yamazaki, Setagaya (JP); Motoki Nakashima, Atsugi (JP); Tatsuya Honda, Nigata (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/564,556

(22) Filed: Dec. 29, 2021

(65) Prior Publication Data

US 2022/0165883 A1    May 26, 2022

Related U.S. Application Data

(63) Continuation of application No. 16/849,113, filed on Apr. 15, 2020, now Pat. No. 11,217,702, which is a
(Continued)

(30) Foreign Application Priority Data

Dec. 17, 2010   (JP) ................................. 2010-282135
Jul. 8, 2011    (JP) ................................. 2011-151859

(51) Int. Cl.
*H01L 29/786*   (2006.01)
*C01G 19/00*    (2006.01)
(Continued)

(52) U.S. Cl.
CPC ........ *H01L 29/7869* (2013.01); *C01G 19/006* (2013.01); *H01L 29/04* (2013.01);
(Continued)

(58) Field of Classification Search
CPC .......................... H01L 29/7869; C01G 19/006
See application file for complete search history.

(56) References Cited

U.S. PATENT DOCUMENTS

| 7,511,343 B2 | 3/2009 | Li et al. |
| 7,598,520 B2 | 10/2009 | Hirao et al. |

(Continued)

FOREIGN PATENT DOCUMENTS

| CN | 001941299 A | 4/2007 |
| CN | 101162737 A | 4/2008 |

(Continued)

OTHER PUBLICATIONS

Fukumoto.E et al., "High Mobility Oxide Semiconductor TFT for Circuit Integration of AM-OLED", IDW'10 : Proceedings of the 16th International Display Workshops, Dec. 1, 2010, pp. 631-634.
(Continued)

*Primary Examiner* — Khanh T Nguyen
(74) *Attorney, Agent, or Firm* — Robinson Intellectual Property Law Office; Eric J. Robinson

(57) ABSTRACT

An object is to provide a material suitably used for a semiconductor included in a transistor, a diode, or the like. Another object is to provide a semiconductor device including a transistor in which the condition of an electron state at an interface between an oxide semiconductor film and a gate insulating film in contact with the oxide semiconductor film is favorable. Further, another object is to manufacture a highly reliable semiconductor device by giving stable electric characteristics to a transistor in which an oxide semiconductor film is used for a channel. A semiconductor device is formed using an oxide material which includes crystal with c-axis alignment, which has a triangular or hexagonal atomic arrangement when seen from the direction of a surface or an interface and rotates around the c-axis.

10 Claims, 25 Drawing Sheets

Related U.S. Application Data continuation of application No. 16/130,588, filed on Sep. 13, 2018, now Pat. No. 11,049,977, which is a continuation of application No. 15/178,949, filed on Jun. 10, 2016, now Pat. No. 10,079,309, which is a continuation of application No. 13/325,700, filed on Dec. 14, 2011, now Pat. No. 9,368,633.

(51) Int. Cl.
  *H01L 29/26* (2006.01)
  *H01L 29/04* (2006.01)

(52) U.S. Cl.
  CPC ............ *H01L 29/045* (2013.01); *H01L 29/26* (2013.01); *H01L 29/78696* (2013.01); *C01P 2002/72* (2013.01)

(56) References Cited

U.S. PATENT DOCUMENTS

| | | | |
|---|---|---|---|
| 7,674,650 B2 | 3/2010 | Akimoto et al. |
| 7,732,819 B2 | 6/2010 | Akimoto et al. |
| 7,893,495 B2 | 2/2011 | Li et al. |
| 7,910,490 B2 | 3/2011 | Akimoto et al. |
| 7,932,521 B2 | 4/2011 | Akimoto et al. |
| 7,935,964 B2 | 5/2011 | Kim et al. |
| 7,977,169 B2 | 7/2011 | Hirao et al. |
| 7,993,964 B2 | 8/2011 | Hirao et al. |
| 8,137,594 B2 | 3/2012 | Imanishi et al. |
| 8,153,031 B2 | 4/2012 | Yano et al. |
| 8,193,031 B2 | 6/2012 | Hosoba et al. |
| 8,222,092 B2 | 7/2012 | Yamazaki et al. |
| 8,232,552 B2 | 7/2012 | Yano et al. |
| 8,247,276 B2 | 8/2012 | Kondo et al. |
| 8,274,077 B2 | 9/2012 | Akimoto et al. |
| 8,329,506 B2 | 12/2012 | Akimoto et al. |
| 8,343,800 B2 | 1/2013 | Umeda et al. |
| 8,362,563 B2 | 1/2013 | Kondo et al. |
| 8,415,198 B2 | 4/2013 | Itagaki et al. |
| 8,436,342 B2 | 5/2013 | Park et al. |
| 8,445,902 B2 | 5/2013 | Sato et al. |
| 8,450,732 B2 | 5/2013 | Kim et al. |
| 8,461,582 B2 | 6/2013 | Kimura |
| 8,466,463 B2 | 6/2013 | Akimoto et al. |
| 8,492,757 B2 | 7/2013 | Sakata et al. |
| 8,629,000 B2 | 1/2014 | Kondo et al. |
| 8,629,069 B2 | 1/2014 | Akimoto et al. |
| 8,629,432 B2 | 1/2014 | Sakata et al. |
| 8,633,480 B2 | 1/2014 | Yamazaki et al. |
| 8,643,011 B2 | 2/2014 | Akimoto et al. |
| 8,669,550 B2 | 3/2014 | Akimoto et al. |
| 8,669,556 B2 | 3/2014 | Yamazaki et al. |
| 8,674,972 B2 | 3/2014 | Kurokawa et al. |
| 8,680,522 B2 | 3/2014 | Yamazaki et al. |
| 8,704,216 B2 | 4/2014 | Godo et al. |
| 8,759,206 B2 | 6/2014 | Kimura |
| 8,790,959 B2 | 7/2014 | Akimoto et al. |
| 8,796,069 B2 | 8/2014 | Akimoto et al. |
| 8,841,662 B2 | 9/2014 | Yamazaki et al. |
| 8,884,287 B2 | 11/2014 | Sakata et al. |
| 8,987,822 B2 | 3/2015 | Kondo et al. |
| 8,994,021 B2 | 3/2015 | Yamazaki et al. |
| 9,064,899 B2 | 6/2015 | Godo et al. |
| 9,099,562 B2 | 8/2015 | Akimoto et al. |
| 9,136,389 B2 | 9/2015 | Yamazaki et al. |
| 9,136,390 B2 | 9/2015 | Yamazaki et al. |
| 9,209,283 B2 | 12/2015 | Kondo et al. |
| 9,252,288 B2 | 2/2016 | Akimoto et al. |
| 9,331,208 B2 | 5/2016 | Yamazaki et al. |
| 9,368,633 B2 | 6/2016 | Yamazaki et al. |
| 9,443,981 B2 | 9/2016 | Kondo et al. |
| 9,660,102 B2 | 5/2017 | Godo et al. |
| 9,704,976 B2 | 7/2017 | Asano et al. |
| 9,711,651 B2 | 7/2017 | Yamazaki et al. |
| 9,859,306 B2 | 1/2018 | Kondo et al. |
| 9,893,200 B2 | 2/2018 | Akimoto et al. |
| 9,941,393 B2 | 4/2018 | Kimura |
| 9,997,638 B2 | 6/2018 | Godo et al. |
| 10,079,309 B2 | 9/2018 | Yamazaki et al. |
| 10,096,623 B2 | 10/2018 | Kondo et al. |
| 10,326,008 B2 | 6/2019 | Kimura |
| 10,403,763 B2 | 9/2019 | Akimoto et al. |
| 10,586,811 B2 | 3/2020 | Kondo et al. |
| 11,011,549 B2 | 5/2021 | Kondo et al. |
| 2007/0057261 A1 | 3/2007 | Jeong et al. |
| 2007/0072439 A1 | 3/2007 | Akimoto et al. |
| 2007/0194379 A1 | 8/2007 | Hosono et al. |
| 2007/0278490 A1 | 12/2007 | Hirao et al. |
| 2008/0099803 A1 | 5/2008 | Li et al. |
| 2008/0299702 A1 | 12/2008 | Son et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2008/0315194 A1 | 12/2008 | Kim et al. |
| 2009/0008639 A1 | 1/2009 | Akimoto et al. |
| 2009/0057132 A1 | 3/2009 | Imanishi et al. |
| 2009/0127552 A1 | 5/2009 | Li et al. |
| 2009/0134389 A1 | 5/2009 | Matsunaga |
| 2009/0152506 A1 | 6/2009 | Umeda et al. |
| 2009/0159963 A1 | 6/2009 | Yamaguchi et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065837 A1 | 3/2010 | Omura et al. |
| 2010/0109003 A1 | 5/2010 | Akimoto et al. |
| 2010/0117078 A1 | 5/2010 | Kuwabara et al. |
| 2010/0163868 A1* | 7/2010 | Yamazaki ........... H01L 27/1225 257/E29.094 |
| 2010/0184253 A1 | 7/2010 | Hirai et al. |
| 2010/0207116 A1 | 8/2010 | Mattmann et al. |
| 2010/0252832 A1 | 10/2010 | Asano et al. |
| 2010/0320456 A1 | 12/2010 | Delahoy et al. |
| 2010/0320459 A1 | 12/2010 | Umeda et al. |
| 2011/0101352 A1 | 5/2011 | Hosono et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0201162 A1 | 8/2011 | Hosono et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0284844 A1 | 11/2011 | Endo et al. |
| 2012/0012838 A1 | 1/2012 | Hosono et al. |
| 2015/0093853 A1 | 4/2015 | Yamazaki et al. |
| 2015/0179805 A1 | 6/2015 | Yamazaki et al. |
| 2017/0317215 A1 | 11/2017 | Yamazaki et al. |
| 2021/0351206 A1 | 11/2021 | Kondo et al. |

FOREIGN PATENT DOCUMENTS

| | | |
|---|---|---|
| CN | 101335304 A | 12/2008 |
| CN | 101356652 A | 1/2009 |
| CN | 101728425 A | 6/2010 |
| CN | 101728435 A | 6/2010 |
| CN | 101740637 A | 6/2010 |
| CN | 103339715 A | 10/2013 |
| EP | 1737044 A | 12/2006 |
| EP | 1764839 A | 3/2007 |
| EP | 1770788 A | 4/2007 |
| EP | 1921681 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2207206 A | 7/2010 |
| EP | 2226847 A | 9/2010 |
| EP | 2246894 A | 11/2010 |
| EP | 2413366 A | 2/2012 |
| JP | 06-275697 A | 9/1994 |
| JP | 08-330103 A | 12/1996 |
| JP | 10-045496 A | 2/1998 |
| JP | 2000-026119 A | 1/2000 |

(56) References Cited

FOREIGN PATENT DOCUMENTS

| | | |
|---|---|---|
| JP | 2003-041362 A | 2/2003 |
| JP | 2005-150635 A | 6/2005 |
| JP | 2007-073701 A | 3/2007 |
| JP | 2007-081362 A | 3/2007 |
| JP | 2007-096055 A | 4/2007 |
| JP | 2007-096126 A | 4/2007 |
| JP | 2007-123861 A | 5/2007 |
| JP | 2008-053356 A | 3/2008 |
| JP | 2008-098637 A | 4/2008 |
| JP | 2008-533693 | 8/2008 |
| JP | 2008-216529 A | 9/2008 |
| JP | 2008-230878 A | 10/2008 |
| JP | 2008-243928 A | 10/2008 |
| JP | 2009-057605 A | 3/2009 |
| JP | 2009-167087 A | 7/2009 |
| JP | 2009-528670 | 8/2009 |
| JP | 2009-249655 A | 10/2009 |
| JP | 2009-272427 A | 11/2009 |
| JP | 2010-003822 A | 1/2010 |
| JP | 2010-040552 A | 2/2010 |
| JP | 2010-040815 A | 2/2010 |
| JP | 4415062 | 2/2010 |
| JP | 2010-103451 A | 5/2010 |
| JP | 2010-118407 A | 5/2010 |
| JP | 2010-135766 A | 6/2010 |
| JP | 2010-161327 A | 7/2010 |
| JP | 2010-171404 A | 8/2010 |
| JP | 2010-177431 A | 8/2010 |
| JP | 2010-186994 A | 8/2010 |
| JP | 2010-212696 A | 9/2010 |
| JP | 2010-530634 | 9/2010 |
| JP | 2010-226101 A | 10/2010 |
| JP | 2010-232645 A | 10/2010 |
| JP | 2010-258434 A | 11/2010 |
| JP | 2012-256819 A | 12/2012 |
| JP | 2013-035740 A | 2/2013 |
| KR | 2004-0022605 A | 3/2004 |
| KR | 2007-0031165 A | 3/2007 |
| KR | 2010-0016406 A | 2/2010 |
| KR | 2010-0048925 A | 5/2010 |
| KR | 10-0971579 | 7/2010 |
| KR | 2010-0095377 A | 8/2010 |
| WO | WO-2007/094501 | 8/2007 |
| WO | WO-2007/142167 | 12/2007 |
| WO | WO-2008/023553 | 2/2008 |
| WO | WO-2008/156311 | 12/2008 |
| WO | WO-2008/156312 | 12/2008 |
| WO | WO-2009/034953 | 3/2009 |
| WO | WO-2009/136645 | 11/2009 |
| WO | WO-2010/018875 | 2/2010 |
| WO | WO-2012/073844 | 6/2012 |
| WO | WO-2012/081591 | 6/2012 |

OTHER PUBLICATIONS

Kim.B et al., "Effects on Annealing Temperature for Solution-Processed IZTO TFTs by Nitrogen Incorporation", Electrochemical and Solid-State Letters, Sep. 16, 2010, vol. 13, No. 12, pp. H419-H422.

International Search Report (Application No. PCT/JP2011/078837) dated Mar. 6, 2012.

Written Opinion (Application No. PCT/JP2011/078837) dated Mar. 6, 2012.

Taniguchi.K et al., "Magnetic Control of Ferroelectric Polarization in a hexaferrite Ba2Mg2Fe12O22", Annual Report (2007), High Field Laboratory for Superconducting Materials, Institute for Materials Research, Tohoku University, Jun. 1, 2008, vol. 2007, pp. 103-104, High Field Laboratory for Superconducting Materials, Institute for Materials Research, Tohoku University.

Notification (Japanese Application No. 2011-274833) dated Mar. 19, 2013.

Information Offer Form (Japanese Application No. 2011-274833) Dated Feb. 22, 2013.

Chinese Office Action (Application No. 201180060652.9) dated Aug. 10, 2015.

Singh.S et al., "Effect of Substrate temperature on the structure and optical properties of ZnO thin films deposited by reactive rf magnetron sputtering", Thin Soild Films, 2007, vol. 515, No. 24, pp. 8718-8722, ELSEVIER.

Taiwanese Office Action (Application No. 100146854) dated Jan. 20, 2016.

Chinese Office Action (Application No. 201180060652.9) dated Jul. 5, 2016.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Chinese Office Action (Application No. 201710165341.8) dated Jan. 6, 2020.

Taiwanese Office Action (Application No. 108125117) dated Mar. 24, 2020.

* cited by examiner

|———————————| 3nm

|———————————| 3nm

OXIDE MATERIAL AND SEMICONDUCTOR DEVICE

TECHNICAL FIELD

The present invention relates to a semiconductor device which includes a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component. Moreover, the present invention relates to an oxide used in the semiconductor device.

In this specification, a "semiconductor device" generally refers to a device which can function by utilizing semiconductor characteristics; an electrooptic device, a display device such as a light-emitting display device, a semiconductor circuit, and an electronic device are all included in semiconductor devices.

BACKGROUND ART

Many transistors formed over a glass substrate or the like are manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

Other than a transistor formed using silicon, a technique in which a transistor is formed using an oxide semiconductor and applied to an electronic device or an optical device has attracted attention. For example, a technique of manufacturing a transistor by using zinc oxide or In—Ga—Zn—O-based oxide as oxide semiconductor, and of using the transistor for a switching element of a pixel of a display device and the like is disclosed in Patent Document 1 and Patent Document 2.

REFERENCE

[Patent Document 1] Japanese Published Patent Application No. 2007-123861

[Patent Document 2] Japanese Published Patent Application No. 2007-096055

DISCLOSURE OF INVENTION

An object of one embodiment of the present invention is to provide a material suitably used for a semiconductor included in a transistor, a diode, or the like.

Another object is to provide a highly reliable semiconductor device which can be manufactured with use of a large-sized substrate such as a mother glass for mass production.

Electric characteristics of a transistor is easily affected by an electron state at an interface between an oxide semiconductor film and a gate insulating film in contact with the oxide semiconductor film. When the interface between the oxide semiconductor film and the gate insulating film is in an amorphous state during the manufacturing the transistor or after manufacture of the transistor, the defect density at the interface is high, and thus electric characteristics of the transistor is likely to be unstable.

Further, electric characteristics of a transistor in which an oxide semiconductor film is used for a channel are changed by irradiation with visible light or ultraviolet light.

In view of such problems, an object of one embodiment of the present invention is to provide a semiconductor device including a transistor in which an electron state at an interface between an oxide semiconductor film and a gate insulating film in contact with the oxide semiconductor film is favorable.

Further, an object of one embodiment of the present invention is to manufacture a highly reliable semiconductor device by giving stable electric characteristics to a transistor in which an oxide semiconductor film is used for a channel.

An oxide material including crystal with c-axis alignment, which has a triangular or hexagonal atomic arrangement when seen from the direction of the a-b plane, a surface, or an interface. In addition, in the crystal, the direction of the a-axis or the b-axis is varied in the a-b plane.

Note that the oxide material may contain zinc. When zinc is contained, it becomes easy to form an oxide material including crystal with c-axis alignment, which has a triangular or hexagonal atomic arrangement when seen from the direction of the a-b plane, a surface, or an interface and in which the direction of the a-axis or the b-axis is varied in the a-b plane.

Alternatively, the oxide material contains two or more kinds of elements selected from indium, gallium, zinc, tin, titanium, and aluminum.

The oxide material can be formed by a sputtering method, a molecular beam epitaxy method, an atomic layer deposition method, a pulsed laser deposition method, or the like.

The oxide material can be formed by stacking two kinds of films whose compositions are different. Alternatively, after two kinds of films are stacked, the oxide material can be formed by crystallizing the films.

One embodiment of the present invention is an oxide material including a plurality of metal oxide layers which are bonded through tetracoordinate oxygen atoms (hereinafter referred to as tetracoordinate O). In addition, one metal oxide layer is a layer which includes a tetracoordinate central metal atom, a pentacoordinate central metal atom, or a central metal atom that can have either five lignads or six ligands and extends in a planar direction by bonding the central metal atoms through a tricoordinate oxygen atom (hereinafter referred to as tricoordinate O) or tetracoordinate O.

In the case where the oxide material has conductivity, the oxide material can be used for a material of a gate electrode of a transistor. The gate electrode may be formed by stacking a film including the oxide material and a metal film.

In the case where the oxide material has conductivity, the oxide material can be used for a source electrode and a drain electrode of a transistor. Note that the source electrode and the drain electrode may be formed by stacking the oxide material and a metal film.

In the case where the oxide material has semiconductor characteristics, a film including the oxide material can be used for an active layer of a transistor. In that case, the film including the oxide material is, for example, provided in contact with a conductive film functioning as a source electrode and a drain electrode and an insulating film in the transistor. Note that the insulating film functions as a gate insulating film, a base insulating film, or an interlayer insulating film in the transistor.

According to one embodiment of the present invention, a semiconductor device having excellent electric characteristics can be provided.

Further, mass production of highly reliable semiconductor devices can be performed with use of a large-sized substrate such as a mother glass.

BEST MODE FOR CARRYING OUT THE INVENTION

Figure 1A:
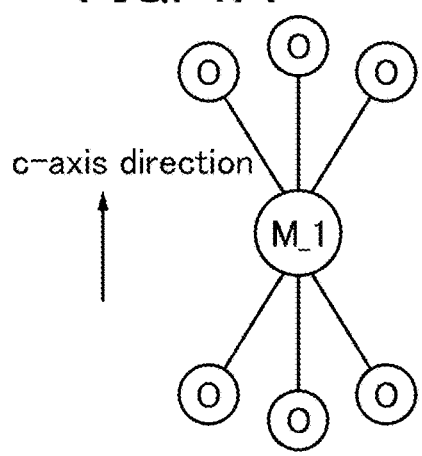
FIGS. 1A to 1D illustrate a structure of an oxide material according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways unless departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a predetermined potential and a reference potential (e.g., a ground potential) in many cases. Accordingly, voltage, potential and a potential difference can be referred to as potential, voltage, and a voltage difference, respectively.

Further, even when the expression "to be connected" is used in this specification, there is a case in which no physical connection is made in an actual circuit and a wiring is just extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a method for forming an oxide film including a crystal with c-axis alignment, which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis). Such a crystal is also referred to as a c-axis aligned crystal (CAAC).

In a broad sense, an oxide including CAAC means a non-single-crystal oxide material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction. Further, the oxide film including CAAC may have a grain boundary, which is a film having a novel structure in which crystals are not necessarily aligned in the a-b plane direction.

CAAC is not single crystal. In addition, the oxide film including CAAC is not composed of only an amorphous component. Although the oxide film including CAAC includes a crystallized portion (crystalline portion), a boundary between one crystalline portion and another crystalline portion is not clear in some cases.

Nitrogen may be substituted for part of oxygen included in the oxide film including CAAC. The c-axes of individual crystalline portions including CAAC may be aligned in a certain direction (e.g., a direction perpendicular to a surface of a substrate over which the oxide film including CAAC is formed or a surface of the oxide film including CAAC). Alternatively, the normals of the a-b planes of the individual crystalline portions including CAAC may be aligned in a certain direction (e.g., a direction perpendicular to a surface of a substrate over which the oxide film including CAAC is formed or a surface of the oxide film including CAAC).

The oxide film including CAAC becomes a conductor, a semiconductor, or an insulator depending on its composition or the like. The CAAC transmits or does not transmit visible light depending on its composition or the like.

An example of an oxide including such a CAAC is a material which is formed into a film shape and has a triangular or hexagonal atomic arrangement when observed from the direction perpendicular to a surface of the film, a surface of a supporting substrate, or an interface and in which metal atoms are arranged in a layered manner or metal atoms and oxygen atoms (or nitrogen atoms) are arranged in a layered manner when a cross section of the film is observed.

The CAAC will be described in detail with reference to FIGS. 1A to 1D. In FIGS. 1A to 1D, the vertical direction corresponds to the c-axis direction and a plane perpendicular to a flat surface in FIGS. 1A to 1D corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

FIG. 1A illustrates a structure having one hexacoordinate metal atom M_1 and six tetracoordinate O proximate to the metal atom M_1. Such a structure in which one metal atom and proximate oxygen atoms to the metal atom are only illustrated is called a subunit here. The structure in FIG. 1A is actually an octahedral structure, but is illustrated as a planar structure for simplicity. Note that three tetracoordinate O exist in each of an upper half and a lower half in FIG. 1A. Although the subunit including only one metal atom is typically illustrated, actually, a plurality of subunits are bonded through tricoordinate O or tetracoordinate O to extend in a planar direction, so that a metal oxide layer is formed.

Figure 1B:
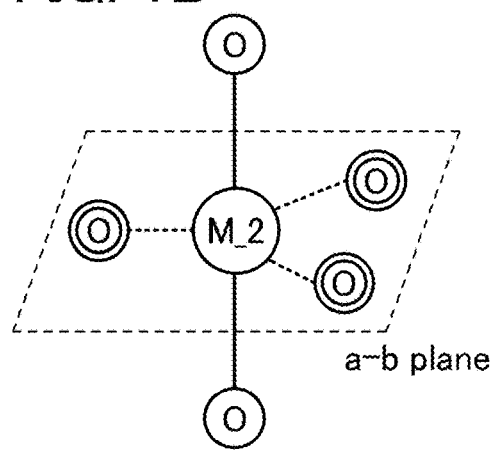

FIG. 1B illustrates a structure having one pentacoordinate metal atom M_2, three tricoordinate O proximate to the metal atom M_2, and two tetrocoordinate O proximate to the metal atom M_2. All the tricoordinate O atoms exist on the a-b plane. One tetracoordinate O exists in each of an upper half and a lower half in FIG. 1B.

Figure 1C:
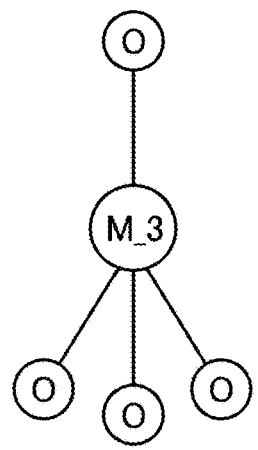

FIG. 1C illustrates a structure having one tetracoordinate metal atom M_3 and four tetracoordinate O proximate to the metal atom M_3. In FIG. 1C, one tetracoordinate O exists in an upper half and three tetracoordinate O exist in a lower half.

A metal atom whose coordination number is 4, 5, or 6 is bonded to another metal atom through a tetracoordinate O. Specifically, a metal atom is bonded to another metal atom through tetracoordinate O, the number of which is four in total. For example, in the case where the hexacoordinate metal atom M_1 is bonded through three tetracoordinate O atoms in the upper half, it is bonded to the pentacoordinate metal atom M_2 through tetracoordinate O in the upper half of the pentacoordinate metal atom M_2, the pentacoordinate metal atom M_2 through tetracoordinate O in the lower half of the pentacoordinate metal atom M_2, or the tetracoordinate metal atom M_3 through the tetracoordinate O in the upper half of the tetracoordinate metal atom M_3.

Besides, subunits are bonded to each other so that the total electric charge in the layered structure is 0.

Here, electric charge of a tricoordinate O for making one bond and electric charge of a tetracoordinate O for making one bond can be assumed to be −0.667 and −0.5, respectively. For example, electric charge of (hexacoordinate or pentacoordinate) In, electric charge of (tetracoordinate) Zn, electric charge of (pentacoordinate) Ga, and electric charge of (pentacoordinate or hexacoordinate) Sn are +3, +2, +3, and +4, respectively. Therefore, electric charge of each of a subunit including In, a subunit including Zn, and a subunit including Ga is 0. Thus, the total electric charge of a layered structure having a combination of such subunits is always 0. On the other hand, electric charge of a subunit including Sn is +1. Therefore, electric charge of −1, which cancels +1, is needed to form a layered structure including Sn. As a structure having electric charge of −1, a structure in which two subunits including Zn are bonded can be given. For example, when one subunit including Sn is combined with one structure in which two subunits including Zn are bonded, electric charge is canceled, whereby the total electric charge in the layered structure can be 0.

Figure 1D:
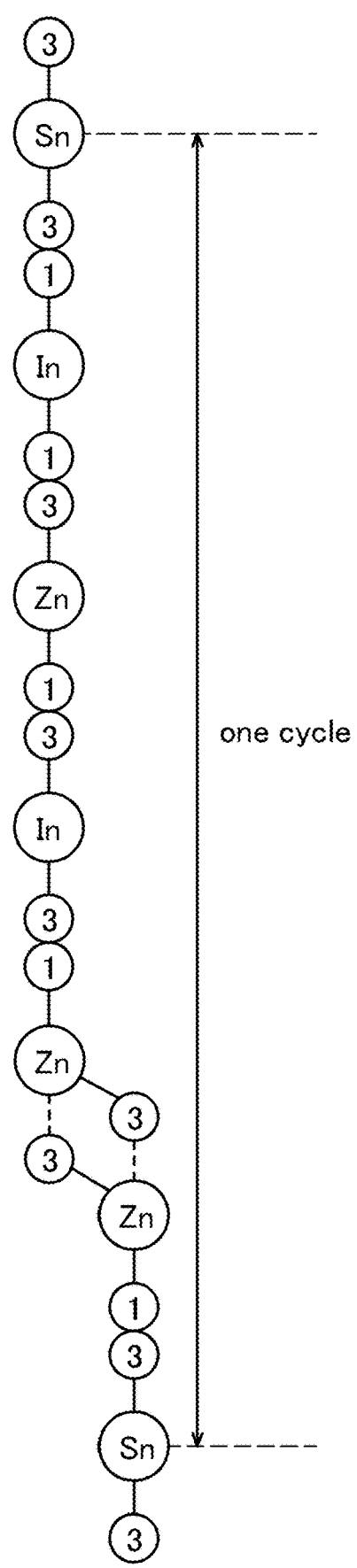

FIG. 1D illustrates an In—Sn—Zn—O-based layered structure. For simplicity, tricoordinate O is omitted, and as for tetracoordinate O, only the number of tetracoordinate O is shown. An In atom can have either five ligands or six ligands. When a structure in which one cycle illustrated in FIG. 1D is repeated is formed, In—Sn—Zn—O-based crystal ($In_2SnZn_3O_8$) can be obtained. Note that a layered structure of the In—Sn—Zn—O-based crystal can be expressed as a composition formula, $In_2SnZn_2O_7(ZnO)_m$ (m is 0 or a natural number). In addition, in a similar manner, with use of an In—Sn—Ga—Zn—O-based material, an In—Ga—Zn—O-based material, an In—Si—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, a Zn—Mg—O-based material, a Sn—Mg—O-based material, an In—Mg—O-based material, an In—Ga—O-based material, an In—O-based material, a Sn—O-based material, a Zn—O-based material, or the like, crystal of oxide can be obtained.

Next, a method for forming an oxide film including CAAC is described.

First, a first oxide film is formed over a substrate by a sputtering method, a molecular beam epitaxy method, an atomic layer deposition method, or a pulsed laser deposition method. Note that by heating the substrate at the time of film formation, an oxide film in which the ratio of a crystalline region to an amorphous region is high can be obtained. For example, the substrate temperature is higher than or equal to 150° C. and lower than or equal to 450° C., preferably, higher than or equal to 200° C. and lower than or equal to 350° C.

Crystallization of the oxide film including CAAC can be further promoted by increasing the substrate temperature.

Next, the substrate may be subjected to first heat treatment. With the first heat treatment, the ratio of the crystalline region to the amorphous region in the oxide film can be further increased. The first heat treatment may be performed at a temperature, for example, higher than or equal to 200° C. and lower than the strain point of the substrate, and is preferably performed at a temperature higher than or equal to 250° C. and lower than or equal to 450° C. The first heat treatment is performed in an oxidizing atmosphere, an inert atmosphere, or a reduced-pressure atmosphere, but the atmosphere is not limited thereto. The treatment time is 3 minutes to 24 hours. As the treatment time is prolonged, the ratio of the crystalline region to the amorphous region in the oxide film can be increased. However, heat treatment for longer than 24 hours is not preferable because the productivity is reduced.

The oxidizing atmosphere is an atmosphere containing an oxidizing gas. The oxidizing gas is oxygen, ozone, nitrous oxide, or the like, and it is preferable that the oxidation gas does not contain water, hydrogen, and the like. For example, the purity of oxygen, ozone, or nitrous oxide to be introduced into a heat treatment apparatus is greater than or equal to 8N (99.999999%), preferably greater than or equal to 9N (99.9999999%), i.e., the impurity concentration is lower than or equal to 1 ppm, preferably, lower than 0.1 ppm. As the oxidizing atmosphere, an oxidizing gas and an inert gas may be mixed to be used. In that case, the mixture contains an oxidizing gas at a concentration of higher than or equal to 10 ppm.

Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

For the first heat treatment, a rapid thermal anneal (RTA) apparatus can be used. With use of the RTA apparatus, only in a short time, the heat treatment can be performed at a temperature higher than or equal to the strain point of the substrate. Thus, the time required for formation of the oxide film in which the ratio of a crystalline region to an amorphous region is high can be shortened.

Further, a material represented by $InMO_3(ZnO)_m$ (m is larger than 0) may be used as the oxide. Here, M represents one or more metal elements selected from Ga, Al, Mn, and Co. For example, M may be Ga, Ga and Al, Ga and Mn, Ga and Co, or the like.

Specifically, an In—Ga—Zn—O-based material containing nitrogen at a concentration higher than or equal to $5 \times 10^{19}$ atoms/cm$^3$, preferably higher than or equal to $1 \times 10^{20}$ atoms/cm$^3$, and lower than 7 at. %, becomes an oxide having a c-axis-aligned hexagonal crystal structure, which includes one layer containing Ga and Zn between an In—O crystal plane (a crystal plane containing indium and oxygen) and another In—O crystal plane (a crystal plane containing indium and oxygen). Alternatively, in the In—Ga—Zn—O-based oxide material containing nitrogen with the above range, a plurality of layers containing Ga and Zn may be provided between the In—O crystal planes.

Next, a second oxide film may be formed over the first oxide film, whereby an oxide stack may be formed. The second oxide film can be formed by the same method as the first oxide film.

When the substrate is heated while the second oxide film is formed, the second oxide film can be crystallized with use of the first oxide film as a seed crystal. At this time, to compose the first oxide film and the second oxide film using the same kind of element is referred to as "homo-growth". Alternatively, to compose the first oxide film and the second oxide film using elements, at least one kind of which differs between the first oxide film and the second oxide film, is referred to as "hetero-growth".

Note that second heat treatment may be performed after the second oxide film is formed. The second heat treatment may be performed in a manner similar to that of the first heat treatment. With the second heat treatment, an oxide stack in which the ratio of a crystalline region to an amorphous region is high can be obtained. Further, with the second heat treatment, the second oxide film can be crystallized with use of the first oxide film as a seed crystal. At this time, homo-growth in which the first oxide film and the second oxide film are composed of the same element may be caused. Alternatively, hetero-growth in which the first oxide film and the second oxide film are composed of elements, at least one kind of which differs between the first oxide film and the second oxide film, may be caused.

Through the above steps, an oxide film including CAAC can be formed.

This embodiment can be implemented in appropriate combination with the other embodiments.

Embodiment 2

In this embodiment, an example of a transistor which includes the oxide film including CAAC described in Embodiment 1 will be described with reference to FIGS. 2A to 2C.

Figure 2A:
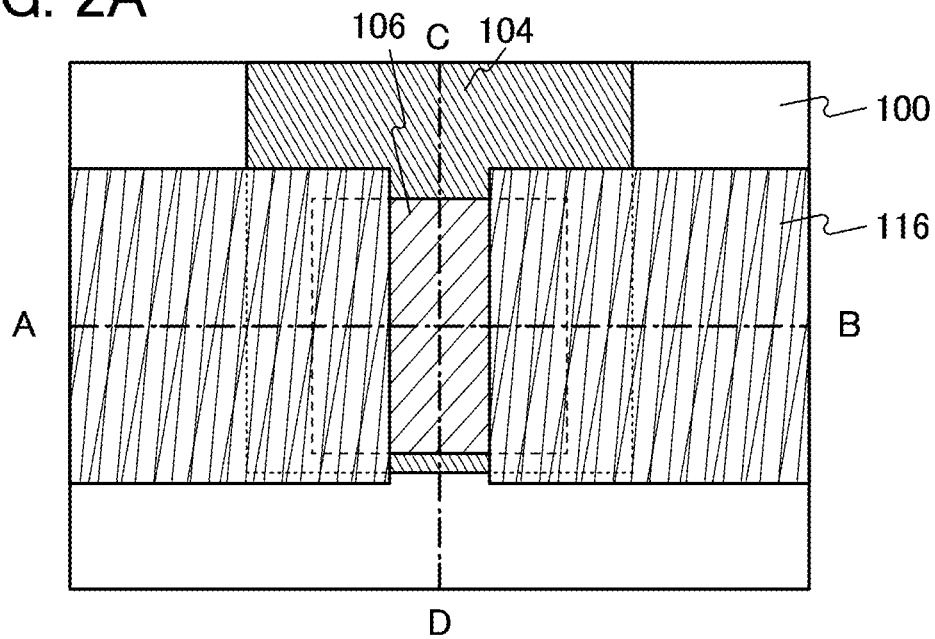
FIGS. 2A to 2C are a top view and cross-sectional views illustrating an example of a semiconductor device which is one embodiment of the present invention.

FIG. 2A is a top view of a transistor. FIGS. 2B and 2C illustrate a cross section A-B and a cross section C-D taken along a dashed-dotted line A-B and a dashed-dotted line C-D shown in FIG. 2A.

Figure 2B:
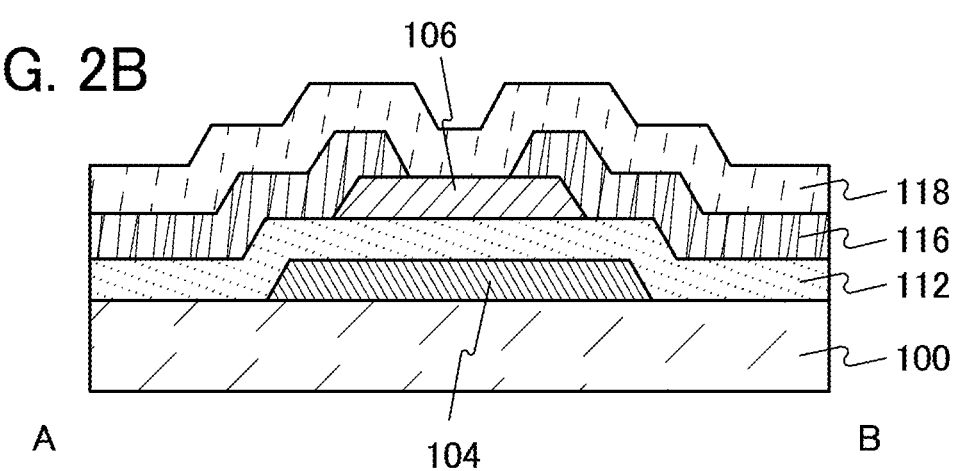
Figure 2C:
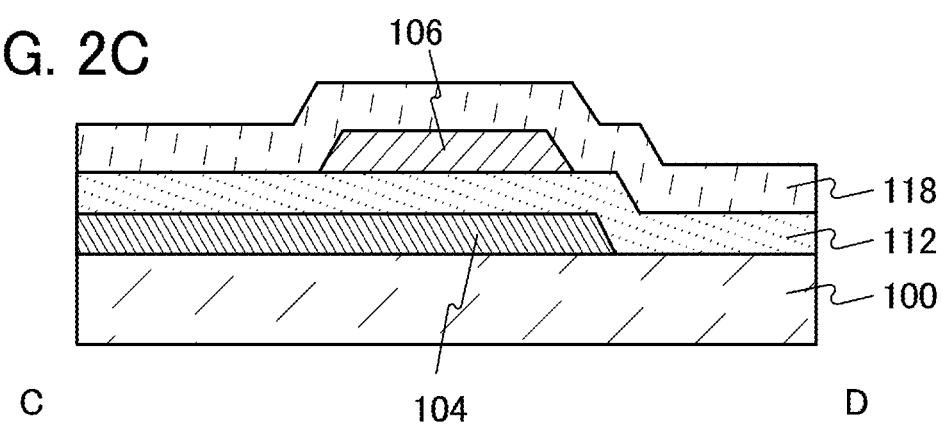

The cross section A-B of FIG. 2B is described in detail below.

The cross section A-B is a cross section of the transistor including a substrate 100, a gate electrode 104 over the substrate 100, a gate insulating film 112 covering the substrate 100 and the gate electrode 104, a semiconductor film 106 over the gate electrode 104 with the gate insulating film 112 positioned therebetween, a pair of electrodes 116 which is over the semiconductor film 106 and partly in contact with the semiconductor film 106, and an interlayer insulating film 118 covering the gate insulating film 112, the semiconductor film 106, and the pair of electrodes 116.

The gate electrode 104 may be formed to have a single-layer structure or a stacked-layer structure, using at least one of the following materials: one of Al, Ti, Cr, Co, Ni, Cu, Y, Zr, Mo, Ag, Ta, and W; a nitride of any of these elements; an oxide of any of these elements; and an alloy of any of these elements. Alternatively, the gate electrode 104 can include a conductive film formed using the oxide film including CAAC described in Embodiment 1 (an oxide conductive film). The composition of the oxide conductive film may control the work function.

Since an oxide conductive film has higher resistance than a metal film, in the case of using an oxide conductive film for the gate electrode 104, it is preferable to use a stacked structure of the oxide conductive layer and a low-resistance film in order to reduce resistance of the gate electrode 104. The low-resistance film is formed using a material selected from the aforementioned materials, so that the sheet resistance is lower than or equal to 10 Ω/sq. Note that in the stacked structure, the oxide conductive film is formed on the gate insulating film 112 side.

Note that in the top view of FIG. 2A, the lateral length and the longitudinal length of the gate electrode 104 are larger than those of the semiconductor film 106, so that degradation and generation of electric charge due to light are suppressed in the semiconductor film 106; however, the size is not limited thereto. The lateral length and the longitudinal length of the semiconductor film 106 in the top view may be larger than those of the gate electrode 104.

There is no particular limitation on the substrate 100 as long as it has at least heat resistance high enough to withstand heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium, or the like, an SOI (silicon on insulator) substrate, or the like may be used. Still alternatively, any of these substrates further provided with a semiconductor element may be used as the substrate 100.

A flexible substrate may alternatively be used as the substrate 100. In that case, a transistor is formed directly on the flexible substrate. Note that as a method for providing the transistor over the flexible substrate, there is also a method in which a non-flexible substrate is used as the substrate 100, the transistor is formed thereover, and then the transistor is separated and transferred to a flexible substrate. In that case, a separation layer is preferably provided between the substrate 100 and the transistor.

As the semiconductor film 106, a silicon film, a germanium film, a silicon germanium film, a silicon carbide film, a gallium nitride film, or a semiconductor film formed using the oxide film including CAAC described in Embodiment 1 (an oxide semiconductor film) may be used. Since the oxide semiconductor film can be formed easily and have high field-effect mobility without laser beam treatment or the like, it is preferably used as a material of the semiconductor film 106. In addition, a transistor in which the interface level of an interface between the oxide semiconductor film and the gate insulating film in contact with the oxide semiconductor film is low can be obtained.

The gate insulating film 112 and the interlayer insulating film 118 may be formed to have a stacked-layer structure or a single-layer structure using, for example, silicon oxide, silicon oxynitride, silicon nitride oxide, silicon nitride, aluminum oxide, hafnium oxide, yttrium oxide, zirconium oxide, or the like. For example, the gate insulating film 112 and the interlayer insulating film 118 may be formed by a thermal oxidation method, a CVD method, a sputtering method, or the like. As each of the gate insulating film 112 and the interlayer insulating film 118, a film from which oxygen is released by heating may be used. With use of such a film from which oxygen is released by heating, defects generated in the semiconductor film 106 can be repaired and electric characteristics of the transistor can be inhibited from being degraded.

In this specification, silicon oxynitride refers to a substance that contains more oxygen than nitrogen and for example, silicon oxynitride includes oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, a silicon nitride oxide film refers to a substance that contains more nitrogen than oxygen and includes oxygen, nitrogen, silicon, and hydrogen at concentrations higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that the above ranges are ranges for cases where measurement is performed using Rutherford backscattering spectrometry (RBS) and hydrogen forward scattering spectrometry (HFS). In addition, the total of the percentages of the constituent elements does not exceed 100 at. %.

In the case where a material of the pair of electrodes 116 diffuses to the semiconductor film 106 and adversely affects the transistor characteristics, each of the gate insulating film 112 and the interlayer insulating film 118 may be an insulating film through which the material of the pair of electrodes 116 is not easily diffused. The interlayer insulating film 118 serves as a protective film of the semiconductor film 106.

To release oxygen by heating means that the released amount of oxygen which is converted to oxygen atoms is greater than or equal to $1\times10^{18}$ atoms/cm$^3$, preferably greater than or equal to $3\times10^{20}$ atoms/cm$^3$ in thermal desorption spectroscopy (TDS).

Here, a method in which the amount of released oxygen is measured on an oxygen atom basis using TDS analysis will now be described.

The amount of released gas in TDS analysis is proportional to the integral value of a spectrum. Therefore, the amount of released gas can be calculated from the ratio between the measured integral value of a spectrum and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to a Numerical Expression 1 with the TDS analysis results of a silicon wafer containing hydrogen at a predetermined density which is the standard sample and the TDS analysis results of the insulating film. Here, all spectra in a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha \qquad \text{(Numerical Expression 1)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Numerical Expression 1. Note that the amount of released oxygen from the above insulating film is measured with a thermal desorption spectroscopy apparatus produced by ESCO Ltd., EMD—WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen on an oxygen atom basis is twice the number of the released oxygen molecules.

In the above structure, the film from which oxygen is released by heating may be an oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the gate insulating film 112 or the interlayer insulating film 118 to the semiconductor film 106 that is an oxide semiconductor film, the interface state density between the semiconductor film 106 and the gate insulating film 112 or the interface state density between the semiconductor film 106 and the interlayer insulating film 118 can be decreased. As a result, carrier trapping at the interface between the semiconductor film 106 and the gate insulating film 112 or the interface between the semiconductor film 106 and the interlayer insulating film 118 can be suppressed, and thus a transistor with less degradation in electric characteristics can be obtained.

Further, electric charge is generated owing to an oxygen vacancy in the oxide semiconductor film in some cases. In general, part of oxygen vacancy in an oxide semiconductor film serves as a donor and causes release of an electron which is a carrier. As a result, the threshold voltage of a transistor shifts in the negative direction. Oxygen is sufficiently supplied from the gate insulating film 112 or the interlayer insulating film 118 to the semiconductor film 106 that is an oxide semiconductor film, whereby the density of oxygen vacancy in the oxide semiconductor film, which causes the negative shift of the threshold voltage, can be reduced.

In other words, a film from which oxygen is released by heating is used for the gate insulating film 112 or the interlayer insulating film 118, the interface state density at an interface between the semiconductor film 106 and the gate insulating film 112 or the interface state density at an interface between the semiconductor film 106 and the interlayer insulating film 118 and the oxygen vacancy density in the semiconductor film 106 that is an oxide semiconductor film can be reduced. Thus, the influence of carrier trapping at the interface between the semiconductor film 106 that is an oxide semiconductor film and the gate insulating film 112 or at the interface between the semiconductor film 106 and the interlayer insulating film 118 can be reduced.

The pair of electrodes 116 may be formed using the metal, the metal nitride, the metal oxide, or the alloy, which is given as the material for the gate electrode 104, or the like as appropriate.

When a film including copper (Cu) is used for the pair of electrodes 116, the resistance of a wiring can be reduced, and generation of wiring delays or the like even in a large-sized display device can be reduced. In the case of using Cu for the pair of electrodes 116, adhesion to the substrate 100 is decreased depending on the material of the substrate 100; thus, it is preferable for the pair of electrodes 116 to have a stacked-layer structure including a film with high adhesion to the substrate 100. As a film with high adhesion to the substrate 100, a film containing Ti, Mo, Mn, Al, or the like may be used. For example, a Cu—Mn—Al alloy may be used.

With the described-above structure, a transistor whose threshold voltage is controlled and electric characteristics are excellent can be obtained. Therefore, a semiconductor device with low power consumption, favorable electric characteristics, and high reliability can be manufactured with high productivity.

This embodiment can be implemented in appropriate combination with the other embodiments.

Embodiment 3

In this embodiment, a transistor having a structure different from that of the transistor described in Embodiments 2 will be described.

Figure 3A:
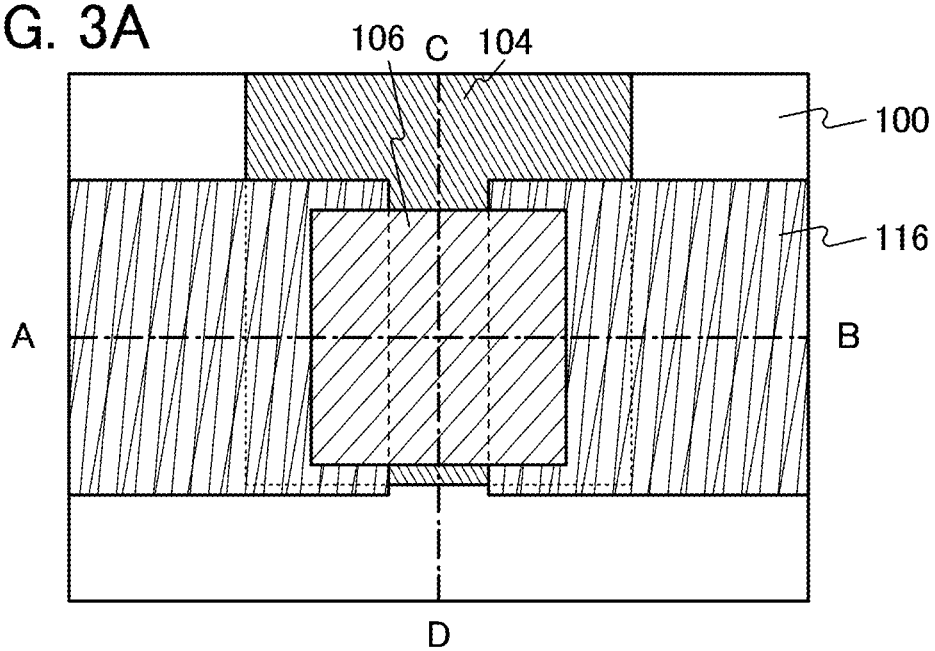
FIGS. 3A to 3C are a top view and cross-sectional views illustrating an example of a semiconductor device which is one embodiment of the present invention.
Figure 3B:
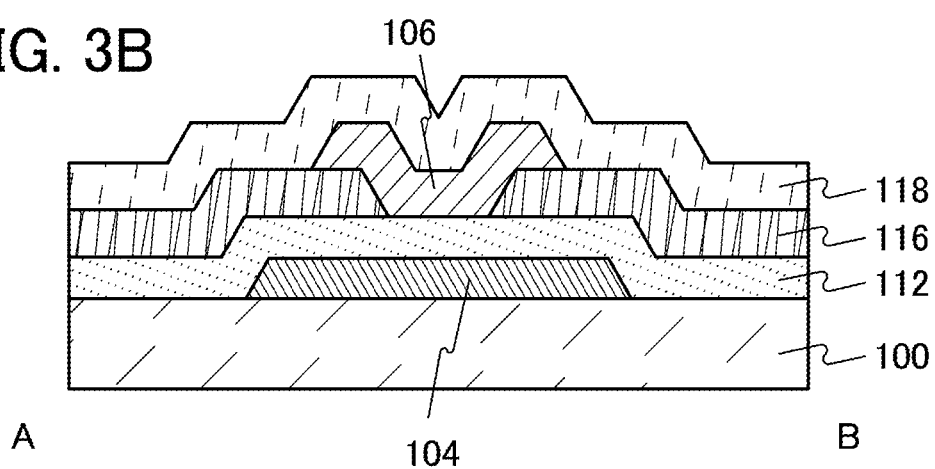
Figure 3C:
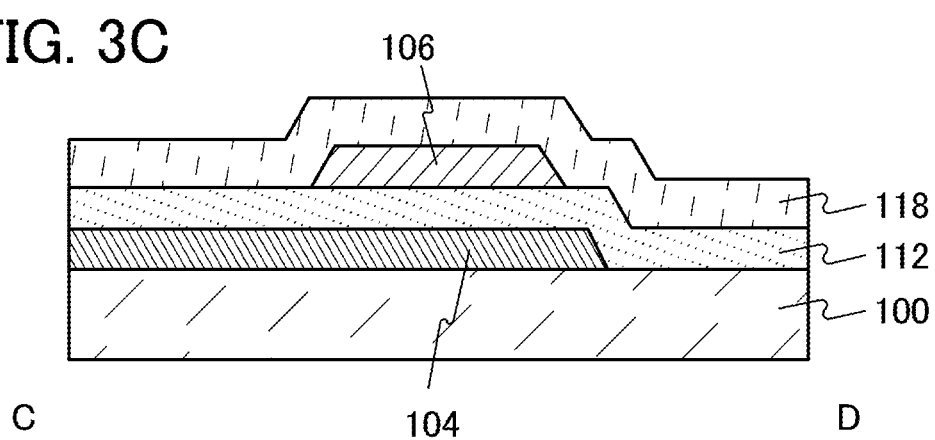

FIGS. 3A to 3C are a top view and cross-sectional views of a transistor which is one embodiment of the present invention. FIGS. 3B and 3C illustrate a cross section A-B and a cross section C-D taken along a dashed-dotted line A-B and a dashed-dotted line C-D in FIG. 3A.

The cross section A-B illustrated in FIG. 3B is described in detail below.

The cross section A-B is a cross-section of the transistor which includes the substrate 100, the gate electrode 104 over the substrate 100, the gate insulating film 112 covering the substrate 100 and the gate electrode 104, the pair of electrodes 116 over the gate insulating film 112, the semiconductor film 106 which is over the gate electrode 104 with the gate insulating film 112 positioned therebetween and partly in contact with the pair of electrodes 116, and the interlayer insulating film 118 covering the gate insulating film 112, and the pair of electrodes 116, and the semiconductor film 106.

The gate electrode 104 and the semiconductor film 106 in this embodiment have structures similar to those of the gate electrode 104 and the semiconductor film 106 in Embodiment 2. With use of the gate electrode including the oxide film including CAAC described in Embodiment 1, the work function is controlled, and the threshold voltage of the transistor can be controlled. In addition, with use of the oxide semiconductor film described in Embodiment 1 as the semiconductor film 106, a transistor in which the interface state density at an interface between the oxide semiconductor film and the gate insulating film in contact with the oxide semiconductor film is low can be obtained.

Figure 4A:
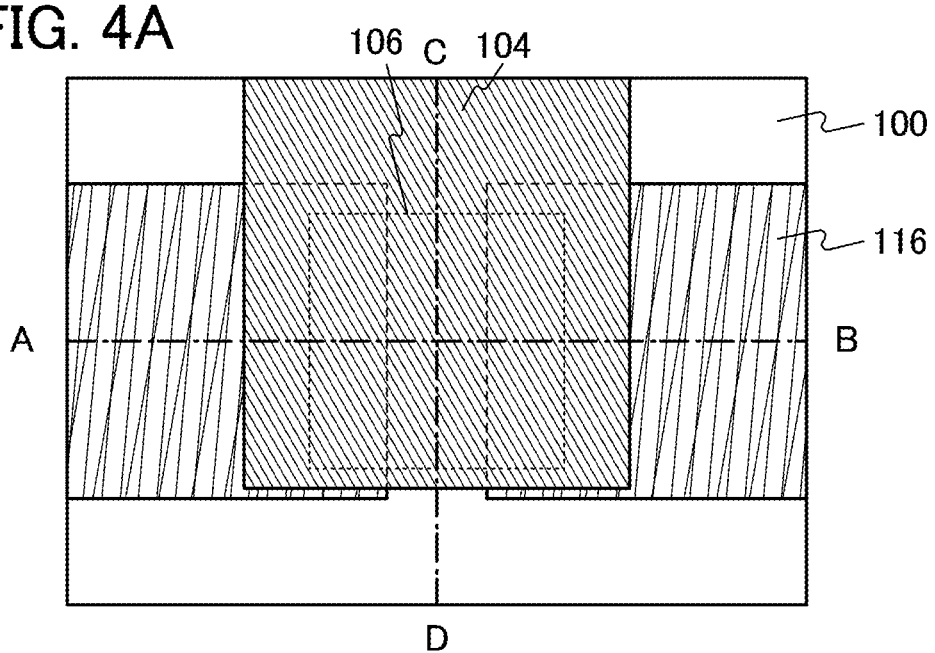
FIGS. 4A to 4C are a top view and cross-sectional views illustrating an example of a semiconductor device which is one embodiment of the present invention.
Figure 4B:
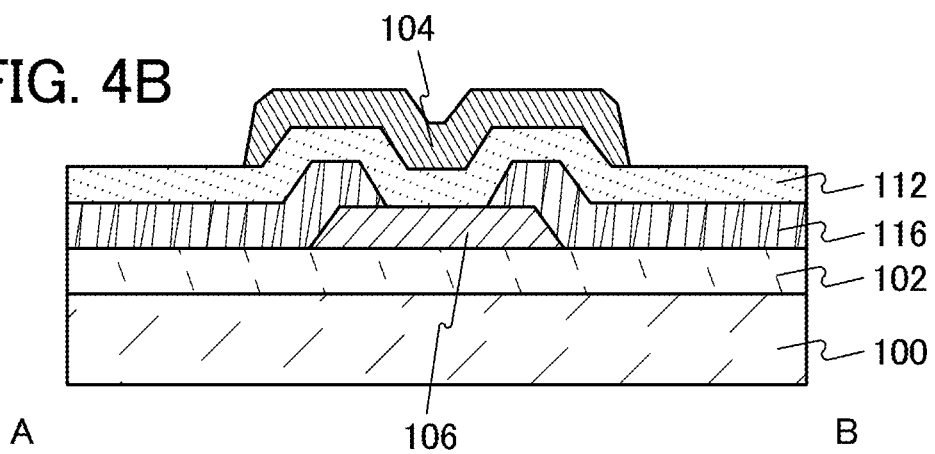
Figure 4C:
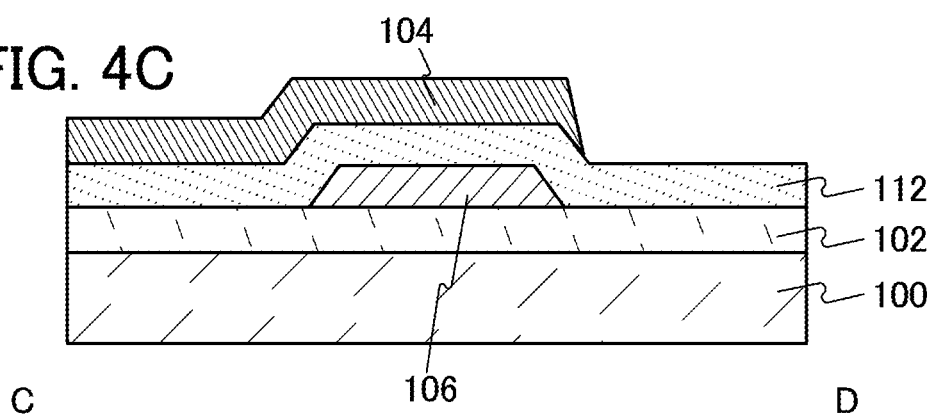

FIGS. 4A to 4C are a top view and cross-sectional views of a transistor which is one embodiment of the present invention. FIGS. 4B and 4C illustrates a cross section A-B and a cross section C-D taken along a dashed-dotted line A-B and a dashed-dotted line C-D shown in FIG. 4A.

The cross section A-B of FIG. 4B is described in detail below.

The cross section A-B is a cross section of the transistor which includes the substrate 100, a base insulating film 102 over the substrate 100, the semiconductor film 106 over the base insulating film 102, the pair of electrodes 116 which is over the semiconductor film 106 and partly in contact with the semiconductor film 106, the gate insulating film 112 covering the semiconductor film 106 and the pair of electrodes 116, and the gate electrode 104 over the semiconductor film 106 with the gate insulating film 112 positioned therebetween.

The base insulating film 102 can have a structure similar to that of the gate insulating film 112 and that of the interlayer insulating film 118.

Figure 5A:
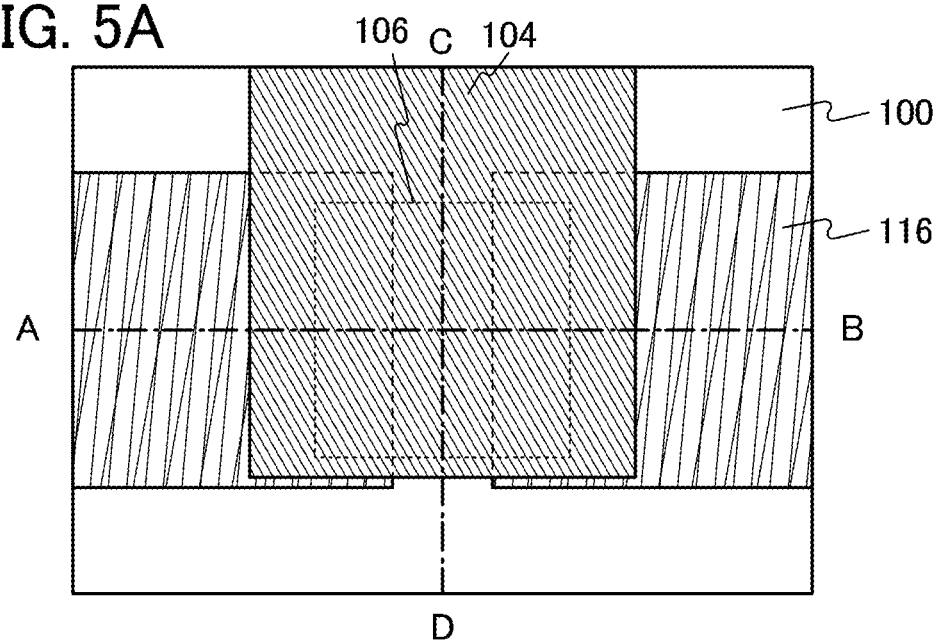
FIGS. 5A to 5C are a top view and cross-sectional views illustrating an example of a semiconductor device which is one embodiment of the present invention.
Figure 5B:
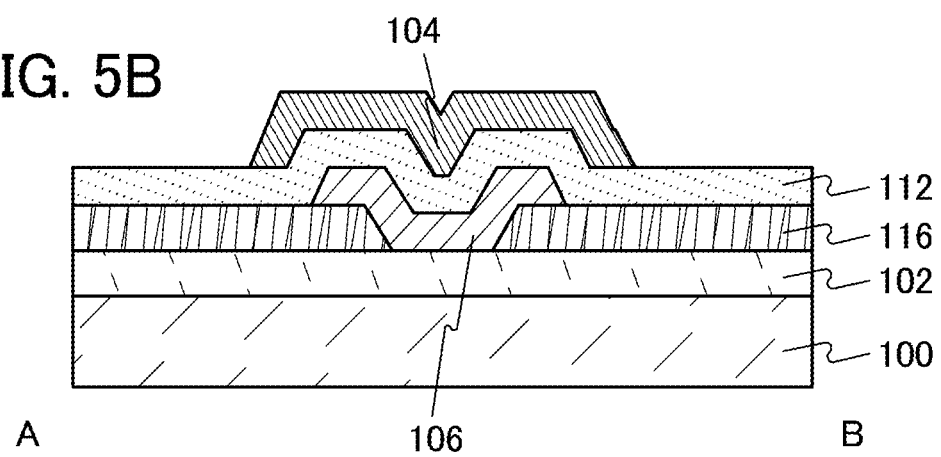
Figure 5C:
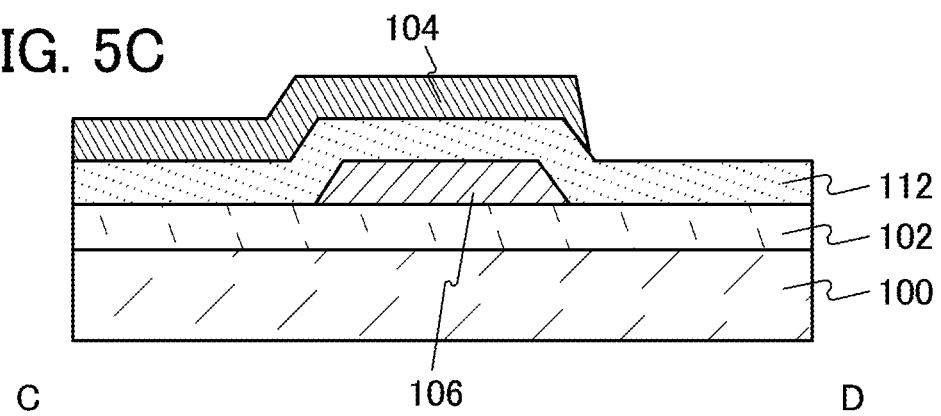

FIGS. 5A to 5C are a top view and cross-sectional views of a transistor which is one embodiment of the present invention. FIGS. 5B and 5C illustrate a cross section A-B and a cross section C-D taken along a dashed-dotted line A-B and a dashed-dotted line C-D shown in FIG. 5A.

The cross section A-B of FIG. 5B is described in detail below.

The cross section A-B is a cross section of the transistor which includes the substrate 100, the base insulating film 102 over the substrate 100, the pair of electrodes 116 over the base insulating film 102, the semiconductor film 106 which is over the pair of electrodes 116 and partly in contact with the pair of electrodes 116, the gate insulating film 112 covering the semiconductor film 106 and the pair of electrodes 116, and the gate electrode 104 over the semiconductor film 106 with the gate insulating film 112 positioned therebetween.

Note that in each of FIG. 3A, FIG. 4A, and FIG. 5A, the lateral length and the longitudinal length of the gate electrode 104 are larger than those of the semiconductor film 106, so that degradation and generation of electric charge due to light are suppressed in the semiconductor film 106; however, the size is not limited thereto. The lateral length and the longitudinal length of the semiconductor film 106 in the top views may be larger than those of the gate electrode 104.

Figure 6A:
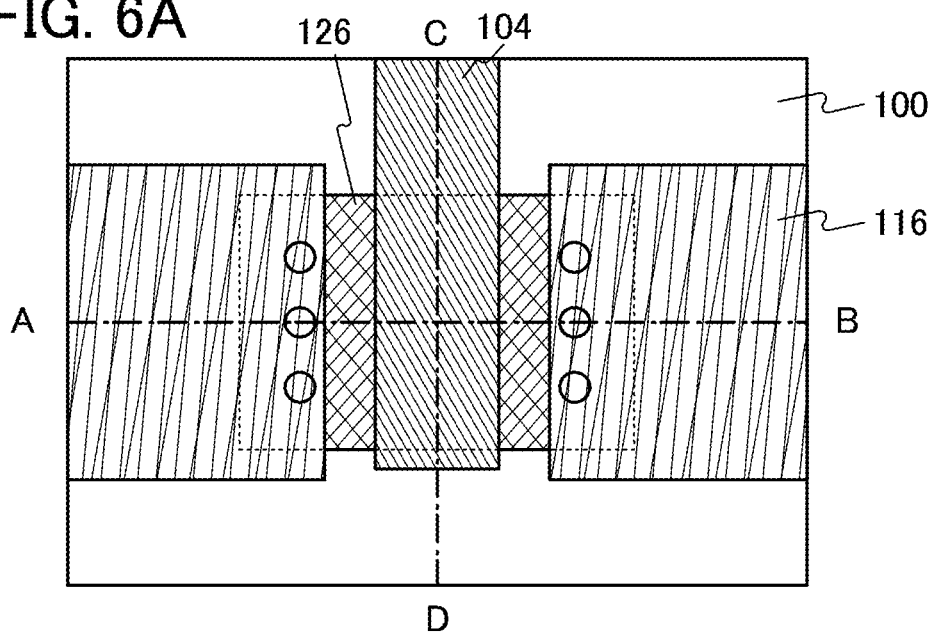
FIGS. 6A to 6C are a top view and cross-sectional views illustrating an example of a semiconductor device which is one embodiment of the present invention.
Figure 6B:
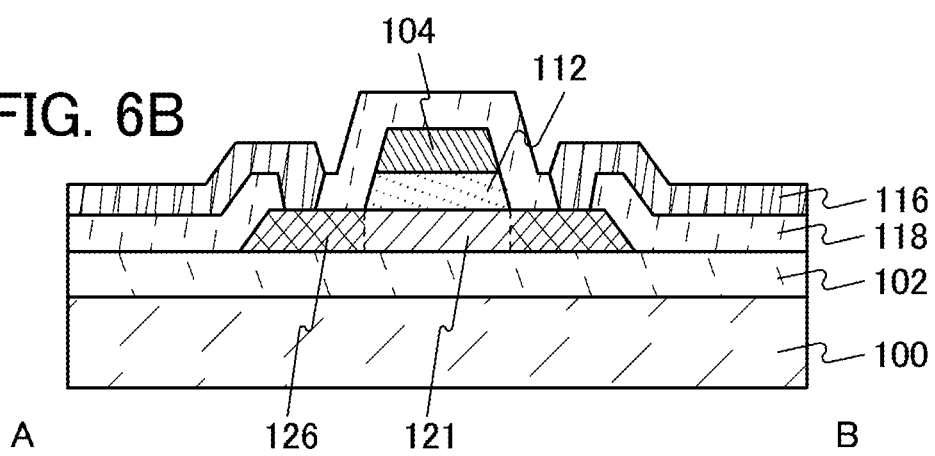
Figure 6C:
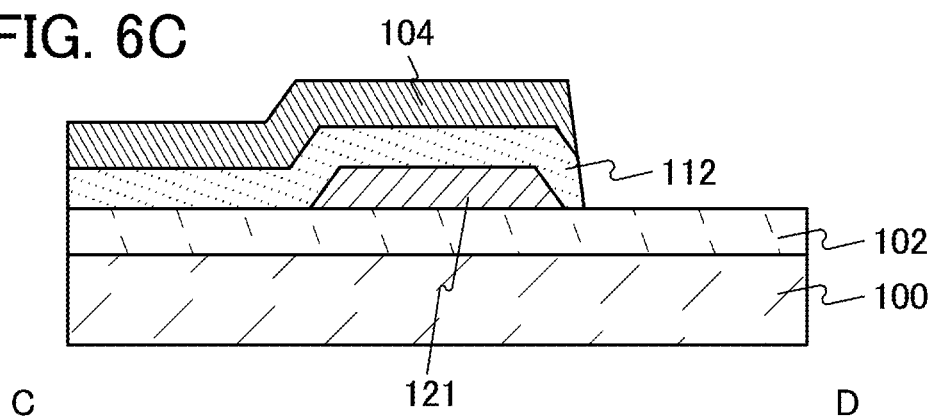

FIGS. 6A to 6C are a top view and cross-sectional views of a transistor which is one embodiment of the present invention. FIGS. 6B and 6C illustrate a cross section A-B and a cross section C-D taken along a dashed-dotted line A-B and a dashed-dotted line C-D shown in FIG. 6A.

The cross section A-B of FIG. 6B is described in detail below.

The cross section A-B is a cross section of the transistor which includes the substrate 100, the base insulating film 102 over the substrate 100, a semiconductor film having a region 126 and a region 121 over the base insulating film 102, the gate insulating film 112 over the region 121, the gate electrode 104 over the gate insulating film 112, the interlayer insulating film 118 covering the base insulating film 102, the region 126, the gate insulating film 112, and the gate electrode 104, and the pair of electrodes 116 in contact with the region 126 through an opening portion which is formed in the interlayer insulating film 118 to expose the region 126.

The gate insulating film 112 and the gate electrode 104 may have substantially the same shape seen from the top surface. The shape can be obtained by processing the gate electrode 104 and the gate insulating film 112 together with use of one mask. Note that after formation of the gate electrode 104 and the gate insulating film 112, the width of the gate electrode 104 may be narrowed by performing plasma treatment or chemical treatment.

The region 121 may have substantially the same shape as the gate insulating film 112 or the gate electrode 104 when seen from the top surface. The shape is obtained by forming the region 126 of the semiconductor film with use of the gate insulating film 112 or the gate electrode 104 as a mask. For example, with use of the gate insulating film 112 or the gate electrode 104 as a mask, an impurity (such as boron, phosphorus, hydrogen, a rare gas, or nitrogen) is introduced to the semiconductor film, so that a region whose resistance is reduced is formed. The thus formed region can be the region 126. Note that the region 121 is a region in the semiconductor film where the region 126 is not formed.

The region 121 functions as a channel region of the transistor. Further, the region 126 functions as a source region and a drain region of the transistor.

Figure 7A:
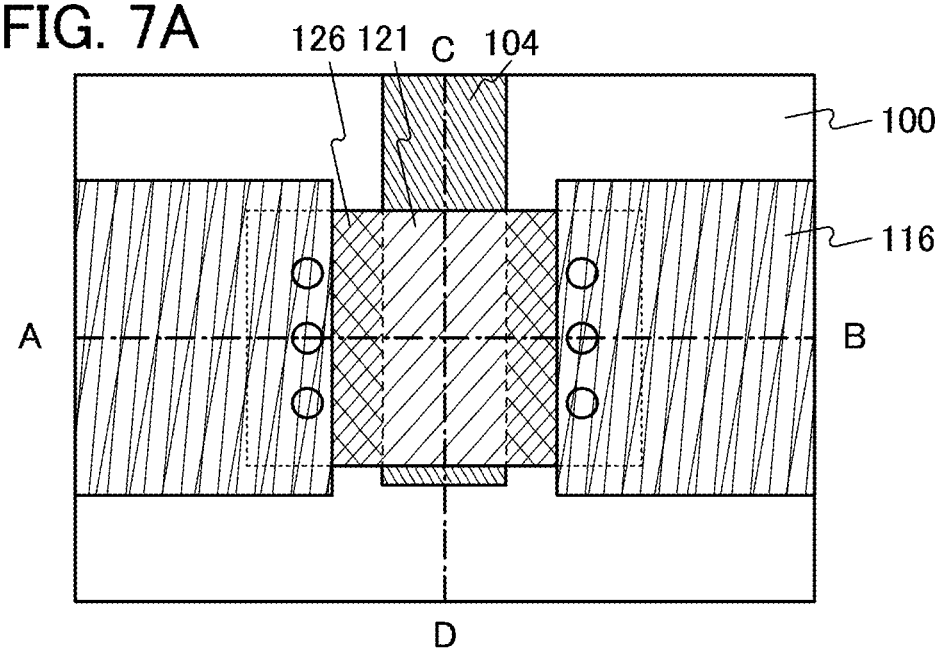
FIGS. 7A to 7C are a top view and cross-sectional views illustrating an example of a semiconductor device which is one embodiment of the present invention.
Figure 7B:
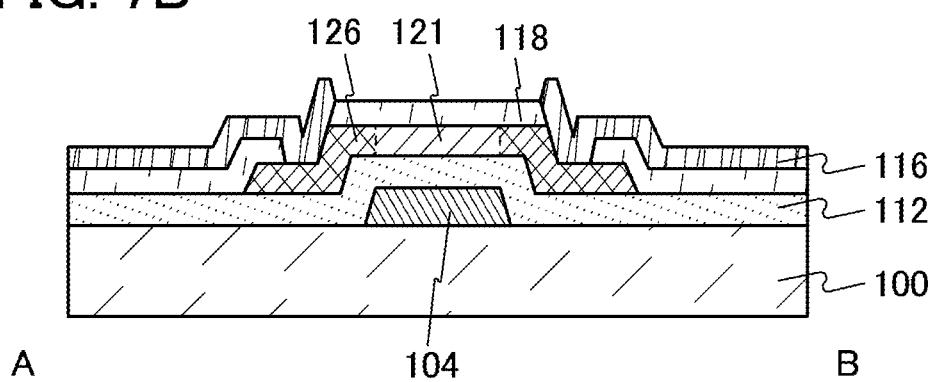
Figure 7C:
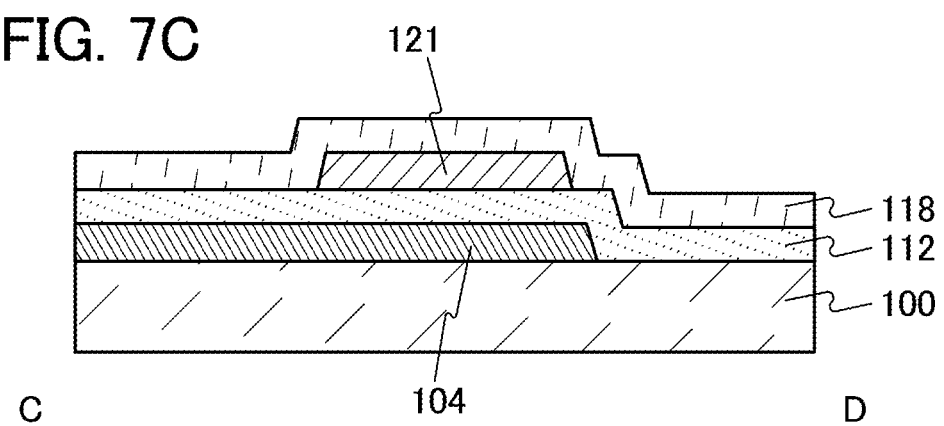

FIGS. 7A to 7C are a top view and cross-sectional views of a transistor which is one embodiment of the present invention. FIGS. 7B and 7C illustrate a cross section A-B and a cross section C-D taken along a dashed-dotted line A-B and a dashed-dotted line C-D in FIG. 7A.

The cross-section A-B of FIG. 7B is described in detail below.

The cross section A-B is a cross-section of the transistor which includes the substrate 100, the gate electrode 104 over the substrate 100, the gate insulating film 112 over the gate electrode 104, a semiconductor film having the region 126 and the region 121 over the gate electrode 104 with the gate insulating film 112 positioned therebetween, the interlayer insulating film 118 covering the semiconductor film and the gate insulating film 112, and the pair of electrodes 116 in contact with the region 126 through an opening portion which is formed in the interlayer insulating film 118 to expose the region 126.

In FIGS. 7A to 7C, the gate insulating film 112 and the gate electrode 104, and the region 121 have substantially the same shape seen from the top surface; however, they are not limited thereto. The gate insulating film 112 and the gate electrode 104, and the region 121 may have different shapes from each other.

With the described-above structure, a transistor whose threshold voltage is controlled and electric characteristics are excellent can be obtained. Therefore, a semiconductor device with low power consumption, favorable electric characteristics, and high reliability can be manufactured with high productivity.

This embodiment can be implemented in appropriate combination with the other embodiments.

Embodiment 4

In this embodiment, a liquid crystal display device manufactured using the transistor described in Embodiment 2 or Embodiment 3 will be described. Note that although an example in which one embodiment of the present invention is applied to the liquid crystal display device is described in this embodiment, application is not limited thereto. For example, application of one embodiment of the present invention to an electroluminescence (EL) display device is readily conceived by those skilled in the art.

Figure 8:
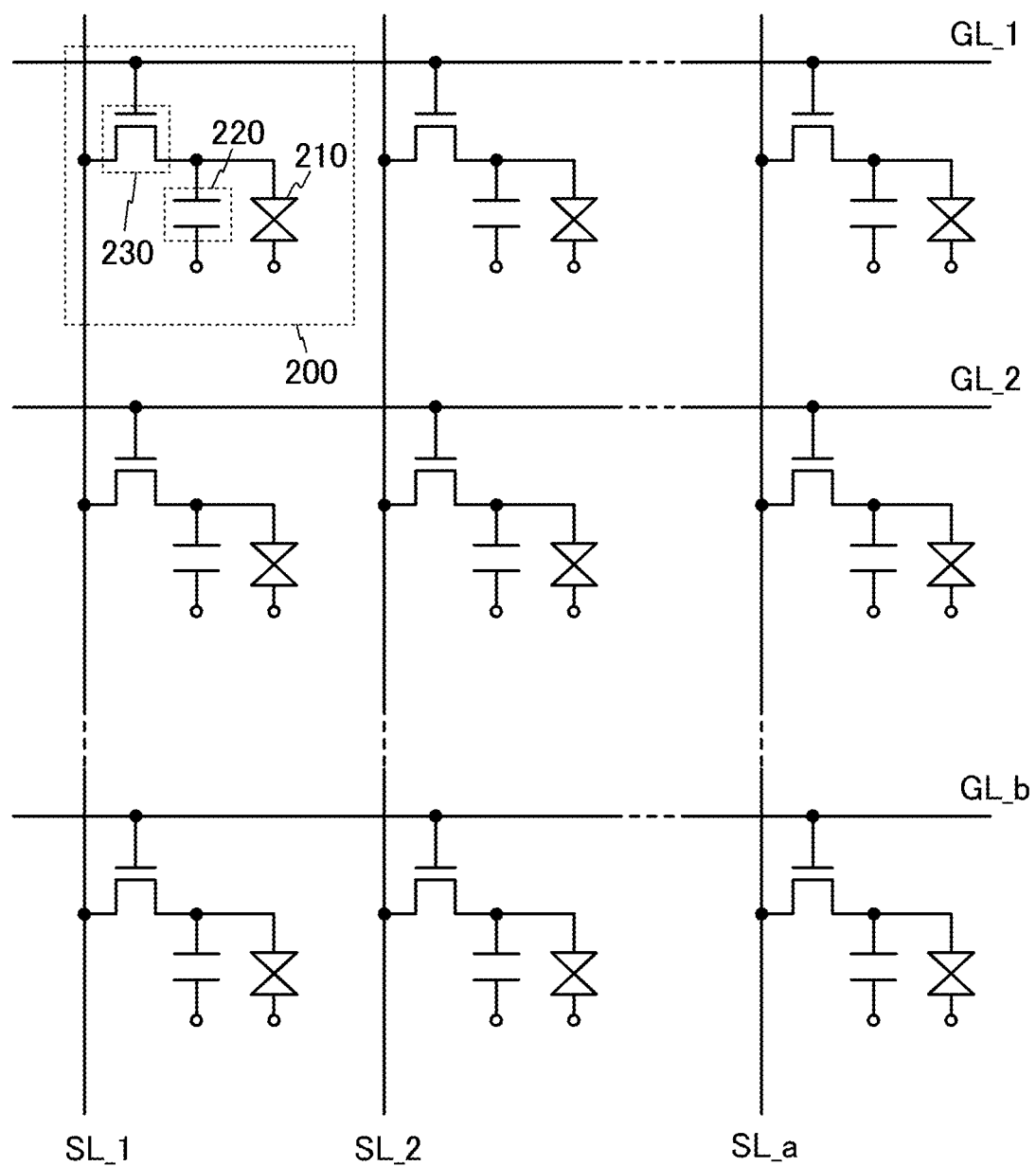
FIG. 8 is a circuit diagram illustrating an example of a liquid crystal display device including a transistor which is one embodiment of the present invention.

FIG. 8 is a circuit diagram of an active matrix liquid crystal display device. The liquid crystal display device includes source lines SL_1 to SL_a, gate lines GL_1 to GL_b, and a plurality of pixels 200. Each pixel 200 includes a transistor 230, a capacitor 220, and a liquid crystal element 210. A pixel portion in the liquid crystal display device is constituted by arranging such a plurality of pixels 200. In the case where the source line or the gate line is simply mentioned, it is denoted as the source line SL or the gate line GL.

As the transistor 230, the transistor described in Embodiment 2 or Embodiment 3 is used. With use of the transistor which is one embodiment of the present invention, a display device with low power consumption, favorable electric characteristics, and high reliability can be obtained.

The gate line GL is connected to a gate of the transistor 230, the source line SL is connected to a source of the transistor 230, and a drain of the transistor 230 is connected to one of capacitor electrodes of the capacitor 220 and one of pixel electrodes of the liquid crystal element 210. The other capacitor electrode of the capacitor 220 and the other pixel electrode of the liquid crystal element 210 are connected to a common electrode. Note that the common electrode may be formed using the same material and in the same layer as the gate line GL.

Further, the gate line GL is connected to a gate driver circuit. The gate driver circuit may include the transistor described in Embodiment 2 or Embodiment 3. Since the threshold voltage of the transistor is controlled, the off-state current can be decreased, and the voltage used for turning the transistor on can be low. Thus, power consumption can be reduced.

The source line SL is connected to a source driver circuit. The source driver circuit may include the transistor described in Embodiment 2 or Embodiment 3. Since the threshold voltage of the transistor is controlled, the off-state current can be decreased, and the voltage used for turning the transistor on can be low. Thus, power consumption can be reduced.

One of or both the gate driver circuit and the source driver circuit may be formed over a substrate which is separately prepared, and a connection method such as a chip on glass (COG) method, a wire bonding method, or a tape automated bonding (TAB) method may be employed.

Since the transistor is easily broken by static electricity or the like, a protection circuit is preferably provided. The protection circuit is preferably formed using a nonlinear element.

When a potential is applied to the gate line GL to be higher than or equal to the threshold voltage of the transistor 230, electric charge supplied from the source line SL flows as a drain current of the transistor 230 and is stored in the capacitor 220. After charging for one column is performed, the transistors 230 in the column are turned off, and the voltage is not given from the source line SL. However, the necessary voltage can be held by the electric charge stored in the capacitor 220. Then, the capacitors 220 in the next column are charged. In such a manner, charging for the first column to a-th column is performed.

Since the threshold voltage of the transistor 230 is controlled, the electric charge stored in the capacitor 220 is barely likely to be discharged, and capacitance of the capacitor 220 can be reduced, so that power consumption needed for charging can be reduced.

Further, in the case where a transistor whose off-state current is small (such as a transistor including an oxide semiconductor film) is used as the transistor 230, a time period during which the voltage is held can be made longer. By this effect, the frequency of rewriting display can be reduced in the case of an image with little motion (including a still image); thus, further reduction in power consumption can be achieved. In addition, capacitance of the capacitor 220 can be further reduced, so that power consumption needed for charging can be reduced.

As described above, according to one embodiment of the present invention, a liquid crystal display device with high reliability and low power consumption can be obtained.

This embodiment can be implemented in appropriate combination with the other embodiments.

Embodiment 5

In this embodiment, an example of manufacturing a semiconductor memory device using the transistor described in Embodiment 2 or Embodiment 3 will be described.

Typical examples of volatile semiconductor memory devices include a dynamic random access memory (DRAM) which stores data by selecting a transistor included in a memory element and storing electric charge in a capacitor and a static random access memory (SRAM) which holds stored data using a circuit such as a flip-flop.

Typical examples of nonvolatile semiconductor memory devices include a flash memory which has a floating gate between a gate electrode and a channel formation region of a transistor and stores data by holding electric charge in the floating gate.

The transistor described in Embodiment 2 or Embodiment 3 can be applied to some of transistors included in the above semiconductor memory device.

First, a volatile memory to which the transistor described in Embodiment 2 or Embodiment 3 is applied is described with reference to FIGS. 9A and 9B.

Figure 9A:
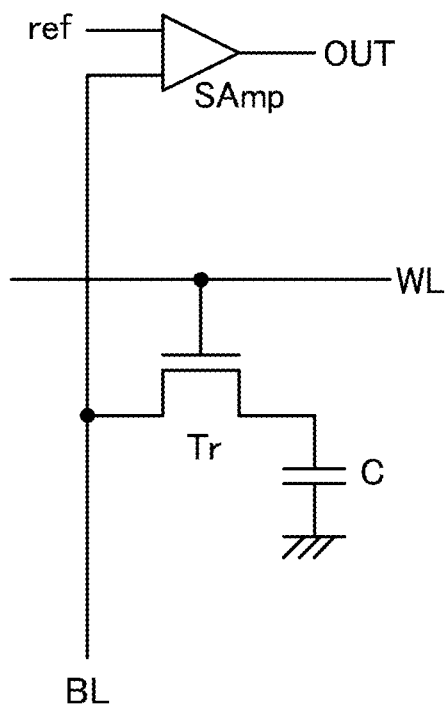
FIGS. 9A and 9B are a circuit diagram illustrating an example of a semiconductor memory device including a transistor which is one embodiment of the present invention and a graph showing electric characteristics.

A memory cell includes a bit line BL, a word line WL, a sense amplifier SAmp, a transistor Tr, and a capacitor C (see FIG. 9A).

Figure 9B:
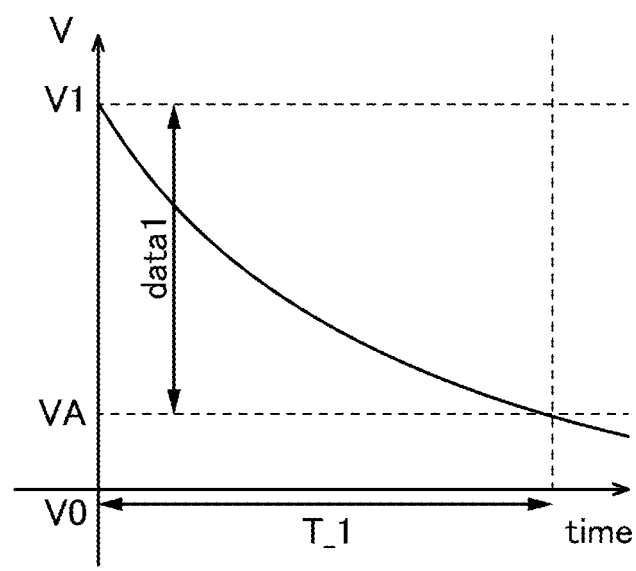

It is known that the voltage held by the capacitor C is gradually reduced over time due to the off-state current of the transistor Tr as shown in FIG. 9B. After a certain period of time, the voltage originally charged from V0 to V1 is decreased to VA which is a limit for reading data 1. This period is called a holding period T_1. In the case of a two-level memory cell, refresh operation needs to be performed within the holding period T_1.

When the transistor described in Embodiment 2 or Embodiment 3 is employed as the transistor Tr, the holding period T_1 can be made longer because the threshold voltage of the transistor is controlled. That is, frequency of the refresh operation can be reduced, which results in reduction in power consumption.

When the transistor whose off-state current is small is used as the transistor Tr, the time period for holding the voltage can further be prolonged, so that the power consumption can be further reduced. For example, when a DRAM is formed using a transistor in which a highly purified oxide semiconductor film is included and the off-state current is less than or equal to $1 \times 10^{-21}$ A, preferably less than or equal to $1 \times 10^{-24}$ A, data can be held for several days to several decades without supply of power.

As described above, according to one embodiment of the present invention, a volatile memory with high reliability and low power consumption can be obtained.

Next, a nonvolatile memory to which the transistor described in Embodiment 2 or Embodiment 3 is applied is described with reference to FIGS. 10A and 10B.

Figure 10A:
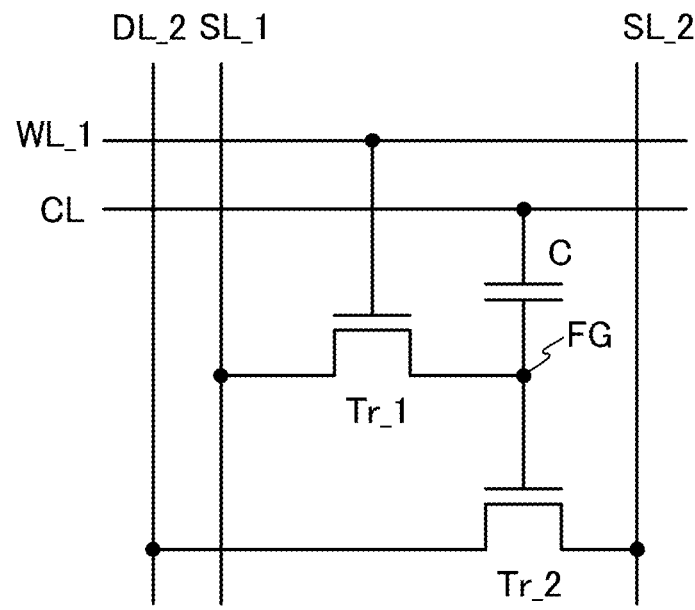
FIGS. 10A and 10B are a circuit diagram illustrating an example of a semiconductor memory device including a transistor which is one embodiment of the present invention and a graph showing electric characteristics.
Figure 10B:
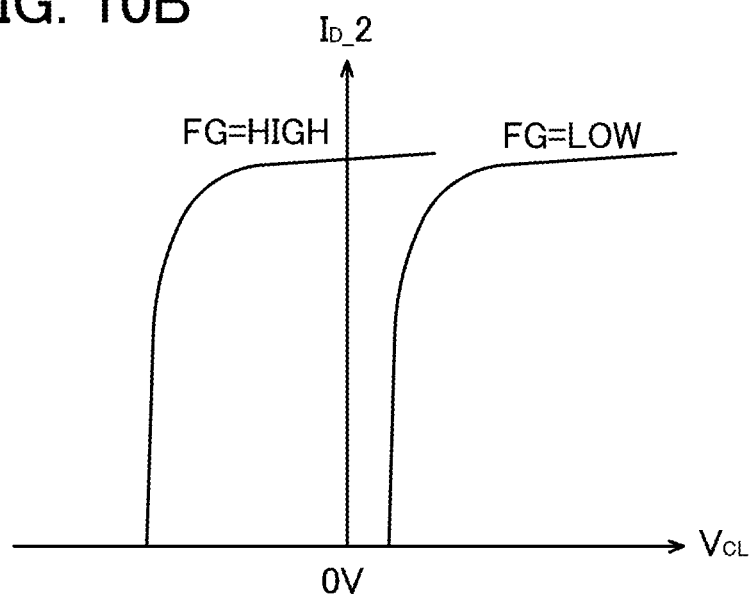

FIG. 10A is a circuit diagram of a nonvolatile memory. The nonvolatile memory includes a transistor Tr_1, a word line WL_1 connected to a gate of the transistor Tr_1, a source wiring SL_1 connected to a source of the transistor Tr_1, a transistor Tr_2, a source wiring SL_2 connected to a source of the transistor Tr_2, a drain wiring DL_2 connected to a drain of the transistor Tr_2, a capacitor C, a capacitor wiring CL connected to one of ends of the capacitor C, and a floating gate FG connected to the other end of the capacitor C, a drain of the transistor Tr_1, and a gate of the transistor Tr_2.

The nonvolatile memory described in this embodiment utilizes variation in the threshold voltage of the transistor Tr_2, which depends on the potential of the floating gate FG. For example, FIG. 10B is a graph showing a relation between the drain current $I_D\_2$ flowing through the transistor Tr_2 and the voltage $V_{CL}$ of the capacitor wiring CL.

The floating gate FG can control voltage through the transistor Tr_1. For example, the potential of the source wiring SL_1 is set to VDD. In this case, when the potential of the word line WL_1 is set to be higher than or equal to the potential obtained by adding VDD to the threshold voltage Vth of the transistor Tr_1, the potential of the floating gate FG can be HIGH. Further, when the potential of the word line WL_1 is set to be lower than or equal to the threshold voltage Vth of the transistor Tr_1, the potential of the floating gate FG can be LOW.

Thus, either a $V_{CL}$-$I_D\_2$ curve (FG=LOW) or a $V_{CL}$-$I_D\_2$ curve (FG=HIGH) can be obtained. In the case where FG=LOW, the drain current $I_D\_2$ is small when $V_{CL}$ is 0 V, so that data 0 is given. In the case where FG=HIGH, the drain current $I_D\_2$ is large when $V_{CL}$ is 0 V, so that data 1 is given. In such a manner, data can be stored.

When the transistor described in Embodiment 2 or Embodiment 3 is employed as the transistor Tr_1, the off-state current of the transistor can be extremely reduced; thus, unintentional leakage of the electric charge stored in the floating gate FG, between the source and the drain of the transistor Tr_1, can be suppressed. As a result, data can be held for a long time. Further, since the threshold voltage of the transistor Tr_1 is controlled in accordance with one embodiment of the present invention, the voltage needed for writing can be reduced, and thus power consumption can be less than that of the flash memory or the like.

Note that the transistor described in Embodiment 2 or Embodiment 3 can be applied to the transistor Tr_2.

Next, a structure of the nonvolatile memory shown in FIG. 10A without the capacitor is described with reference to FIG. 11.

Figure 11:
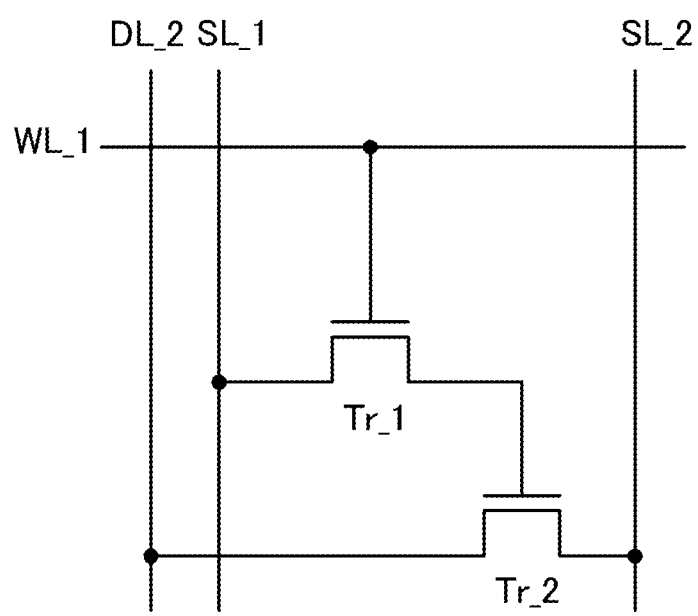
FIG. 11 is a circuit diagram illustrating an example of a semiconductor memory device including a transistor which is one embodiment of the present invention.

FIG. 11 is a circuit diagram of a nonvolatile memory. The nonvolatile memory includes the transistor Tr_1, a word line WL_1 connected to the gate of the transistor Tr_1, the source wiring SL_1 connected to the source of the transistor Tr_1, the transistor Tr_2, the source wiring SL_2 connected to the source of the transistor Tr_2, and the drain wiring DL_2 connected to the drain of the transistor Tr_2. The gate of the transistor Tr_2 is connected to the drain of the transistor Tr_1.

In the case where the transistor whose off-state current is small is used as the transistor Tr_1, electric charge can be held between the drain of the transistor Tr_1 and the gate of the transistor Tr_2 without the capacitor. The structure without the capacitor makes it possible to reduce an area of a memory, and the integration degree can be more increased than that of the structure with a capacitor.

Although the nonvolatile memory including four or five wirings is described in this embodiment, a structure of the nonvolatile memory is not limited thereto. For example, a structure in which one wiring functions as the source wiring SL_1 and the drain wiring DL_2 may be employed.

As described above, according to one embodiment of the present invention, a semiconductor memory device with high reliability and low power consumption can be obtained.

This embodiment can be implemented in appropriate combination with the other embodiments.

Embodiment 6

In this embodiment, examples of electronic devices to which Embodiment 2 or Embodiment 3 is applied will be described.

Figure 12A:
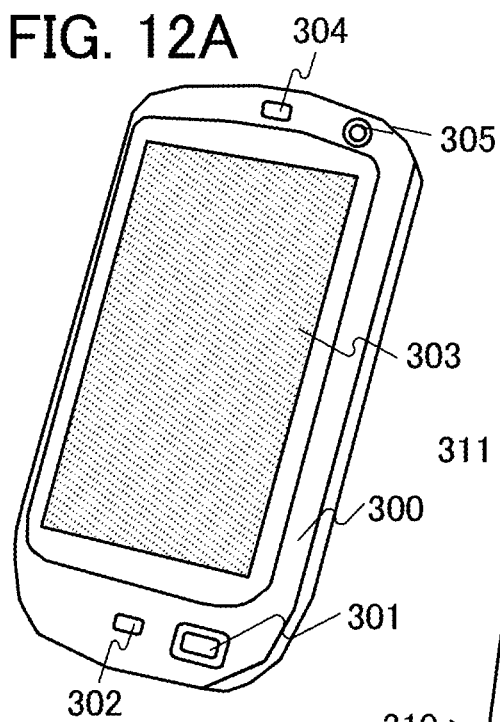
FIGS. 12A to 12C are perspective views each illustrating an example of an electronic device which is one embodiment of the present invention.

FIG. 12A illustrates a portable information terminal, which includes a housing 300, a button 301, a microphone 302, a display portion 303, a speaker 304, and a camera 305, and has a function as a mobile phone. One embodiment of the present invention can be applied to the display portion 303 and the camera 305. Although not illustrated, one embodiment of the present invention can also be applied to an arithmetic unit, a wireless circuit, or a memory device inside the main body.

Figure 12B:
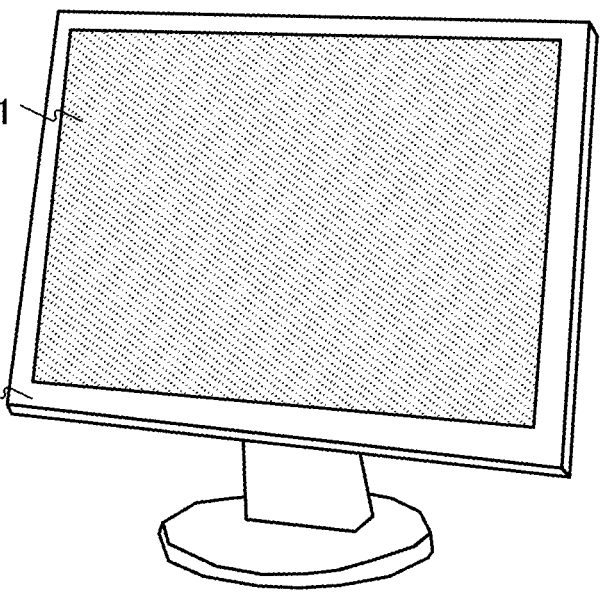

FIG. 12B illustrates a display which includes a housing 310 and a display portion 311. One embodiment of the present invention can be applied to the display portion 311. When one embodiment of the present invention is employed, a display having high display quality can be provided even in the case where the size of the display portion 311 is increased.

Figure 12C:
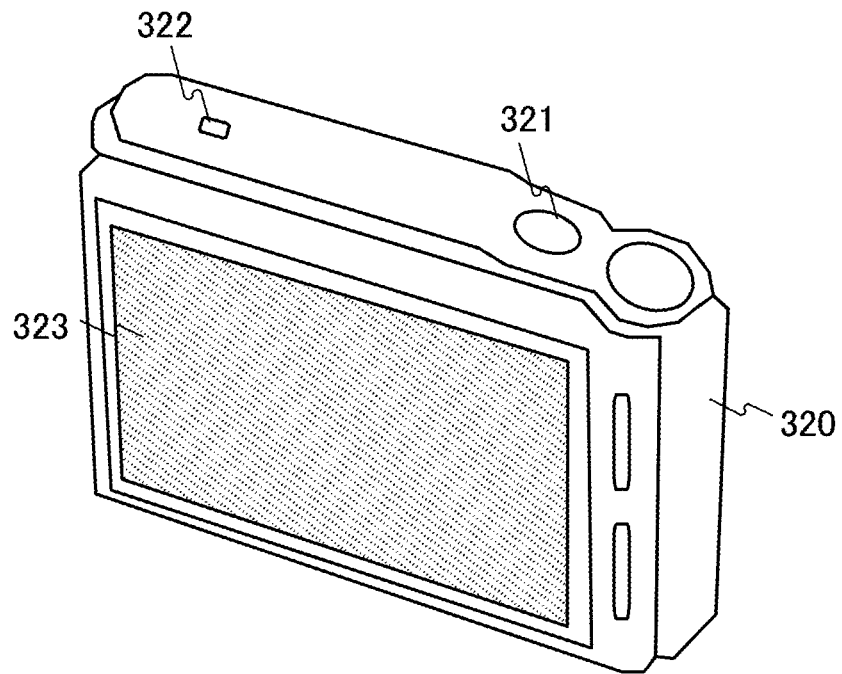

FIG. 12C illustrates a digital still camera which includes a housing 320, a button 321, a microphone 322, and a display portion 323. One embodiment of the present invention can be applied to the display portion 323. Although not illustrated, one embodiment of the present invention can also be applied to a memory device or an image sensor.

When one embodiment of the present invention is employed, cost of an electric device can be reduced. Further, a display device having high display quality can be obtained.

This embodiment can be implemented in appropriate combination with the other embodiments.

Example 1

Figure 13A:
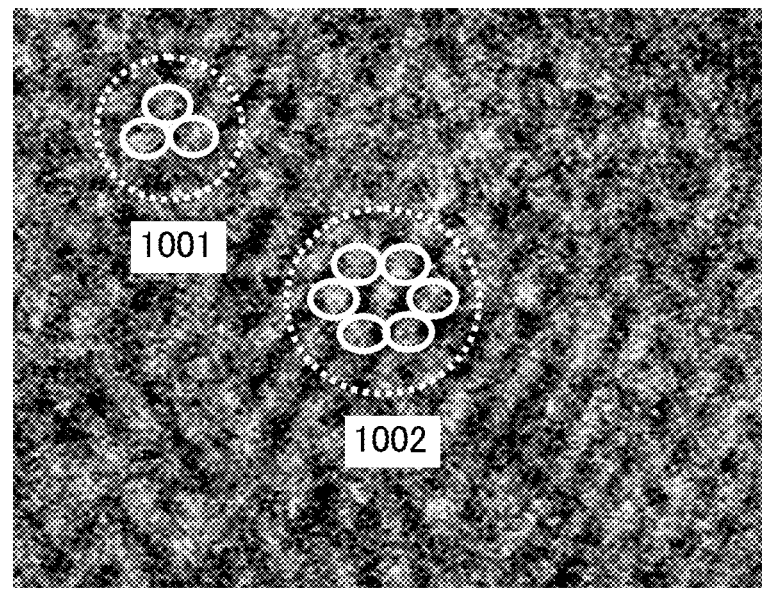
FIGS. 13A and 13B show a planar image and a cross-sectional image of an oxide film including CAAC, which are obtained with HAADF-STEM.
Figure 13B:
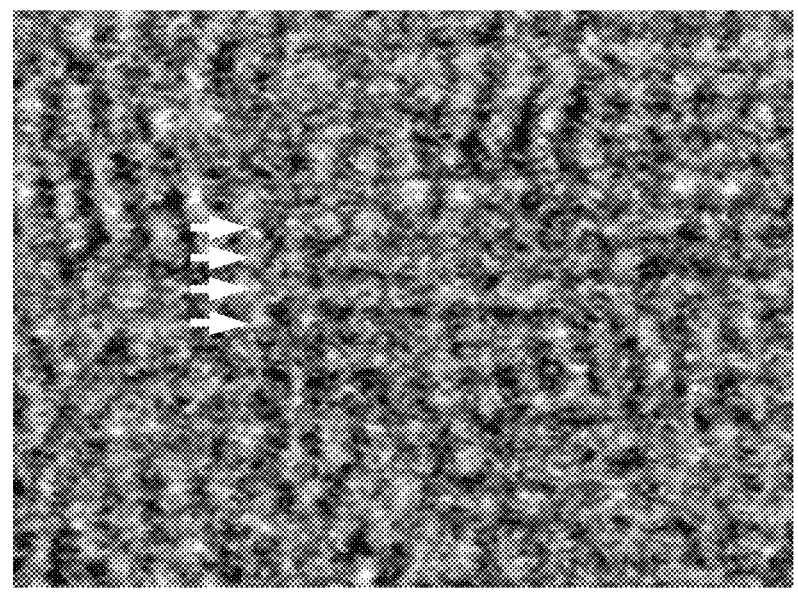
Figure 14A:
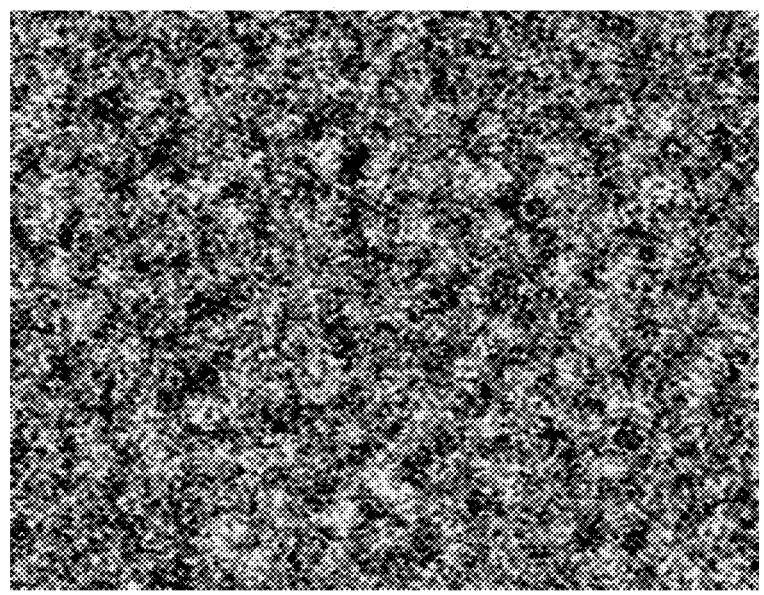
FIGS. 14A and 14B show a planar image and a cross-sectional image of an oxide film which does not include CAAC, which are obtained with HAADF-STEM.
Figure 14B:
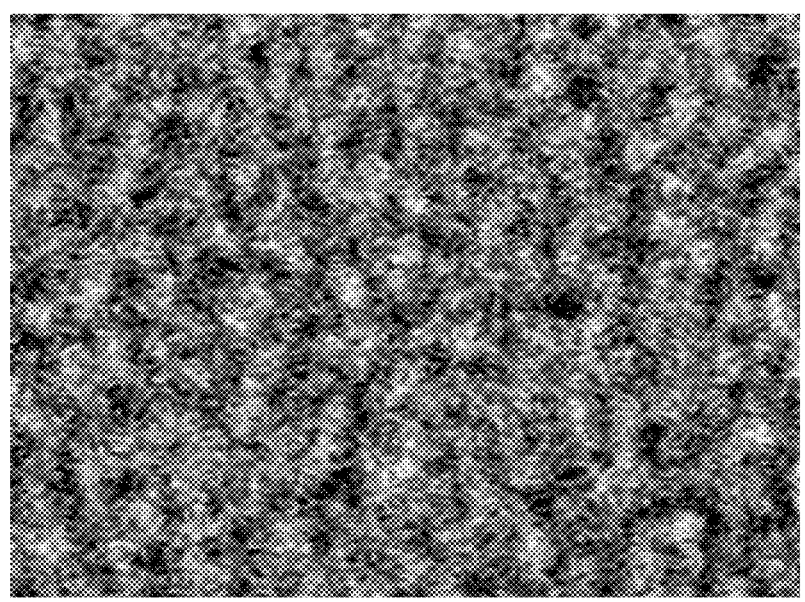

FIGS. 13A and 13B show a planar image and a cross-sectional image of an oxide including CAAC, which are obtained with high-angle annular dark field scanning transmission electron microscopy (HAADF-STEM). FIGS. 14A and 14B show a planar image and a cross-sectional image of an amorphous oxide, which are obtained with HAADF-STEM.

Sample 1 and Sample 2 were In—Ga—Zn—O-based oxide films each formed over a quartz substrate by a DC sputtering method. The other deposition conditions were as follows: a power of 0.5 kW; a deposition pressure of 0.4 Pa; a deposition gas including Ar (35 sccm) and $O_2$ (15 sccm); and a distance of 60 mm between a target and a substrate. As the target, an In—Ga—Zn—O ($In_2O_3$:$Ga_2O_3$:ZnO=1:1:2 [molar ratio]) target was used. Note that the thickness was 100 nm.

Here, in the case of Sample 1, the substrate temperature was 400° C., and in the case of Sample 2, the substrate temperature was room temperature. Heat treatment was not performed after film formation.

From the planar image showing a region 1001 and a region 1002 in FIG. 13A, atoms were arranged to have a triangular or hexagonal shape seen from the direction of the a-b plane, a top surface, or an interface. Further, from the cross-sectional image in FIG. 13B, metal atoms were arranged in the direction indicated by arrows. In other words, metal atoms, or metal atoms and oxygen atoms were arranged in a layered manner in the c-axis direction. As a result, it is found that Sample 1 is an oxide film including CAAC.

From the planar image of FIG. 14A, arrangement of atoms in a triangular or hexagonal shape seen from the direction of a top surface or an interface was not observed. Further, from the cross-sectional image of FIG. 14B, metal atoms, or metal atoms and oxygen atoms were not arranged in a layered manner. As a result, it is found that Sample 2 is not an oxide film including CAAC.

As described above, an oxide film including CAAC was able to be obtained.

Example 2

In this example, an example in which a crystal state of an oxide film including CAAC was evaluated by a X-ray diffraction (XRD) method will be described.

Sample 3 and Sample 4 were In—Ga—Zn—O-based oxide films each formed over a quartz substrate by a DC sputtering method. The other deposition conditions were as follows: a power of 0.5 kW; a deposition pressure of 0.4 Pa; a distance of 60 mm between a target and a substrate; and a substrate temperature of 400° C. As the target, an In—Ga—Zn—O ($In_2O_3$:$Ga_2O_3$:ZnO=1:1:2 [molar ratio]) target was used. Note that the thickness was 300 nm.

A deposition gas for Sample 3 was $O_2$ (40 sccm), and a deposition gas for Sample 4 was $N_2$ (40 sccm).

Figure 15:
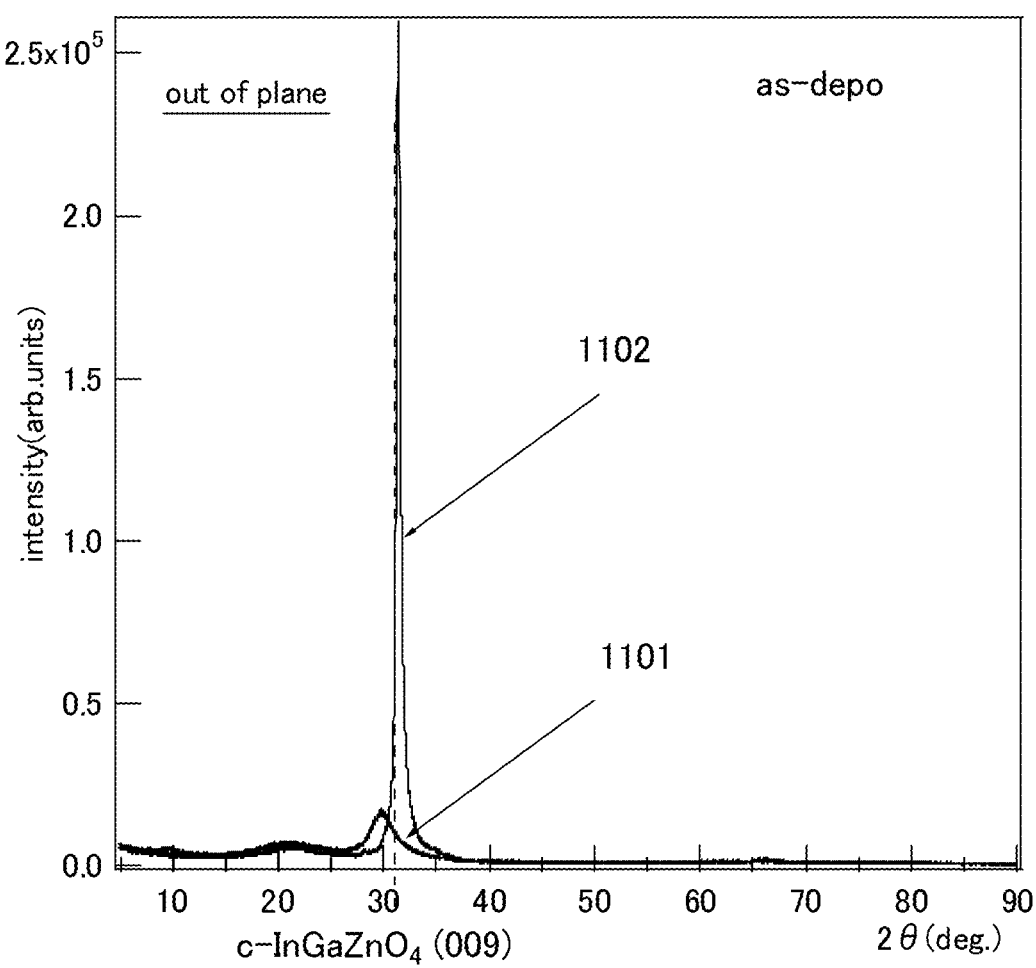
FIG. 15 shows XRD spectra of oxide films including CAAC as deposited (as-depo).
Figure 16:
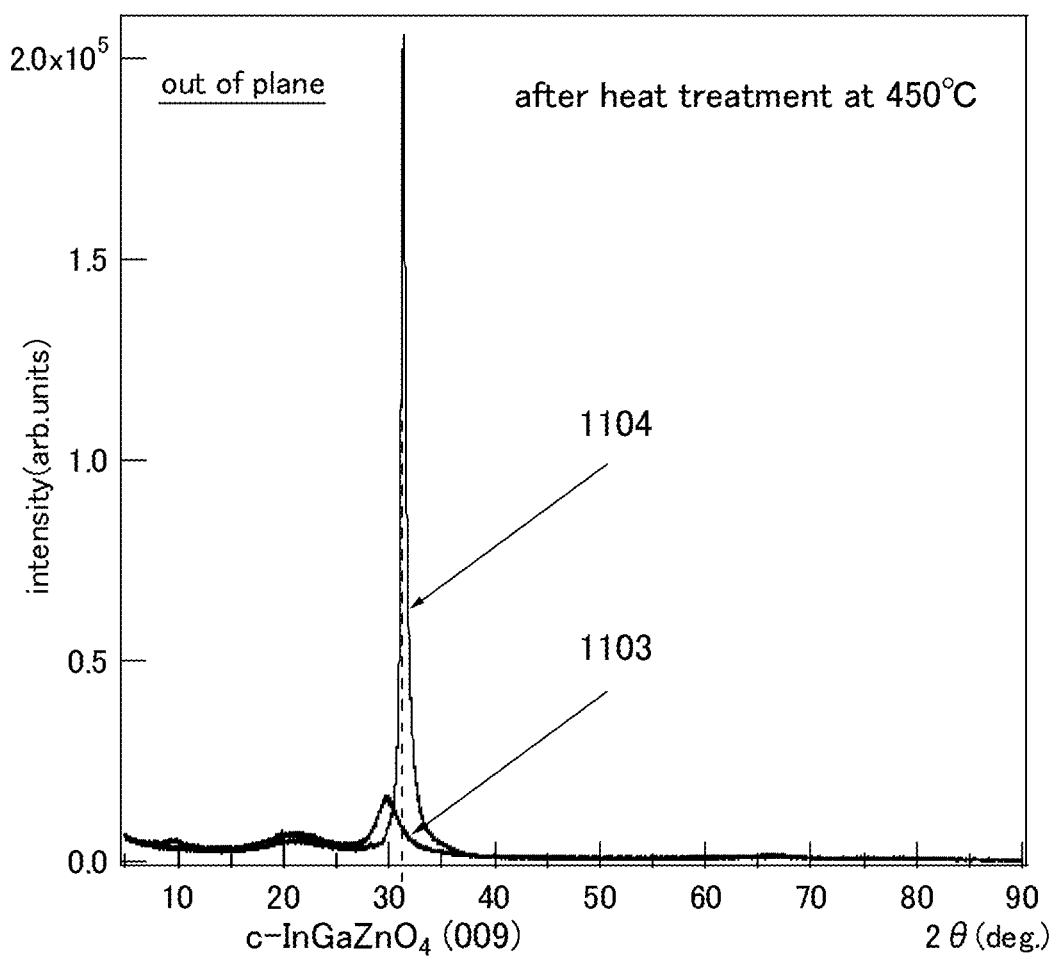
FIG. 16 shows XRD spectra of oxide films including CAAC after heat treatment.

FIG. 15 and FIG. 16 each show XRD spectra obtained by an out-of-plane method. FIG. 15 shows XRD spectra after deposition (as-depo), and FIG. 16 shows XRD spectra after heat treatment at 450° C. for an hour in an $N_2$ atmosphere, which was performed after the deposition. Here, a solid line 1101 and a solid line 1103 each indicate an XRD spectrum of Sample 3, and a solid line 1102 and a solid line 1104 each indicate an XRD spectrum of Sample 4.

From FIG. 15 and FIG. 16, the samples which were formed under both conditions each had a peak at a position corresponding to the (009) plane, which means the presence of strong alignment in the c-axis direction. Thus, it was found that Sample 3 and Sample 4 had c-axis alignment. In particular, Sample 4 had high peak intensity at a position corresponding to the (009) plane. Further, in Sample 3, the peak position corresponding to the (009) plane was shifted to a smaller angle side.

Figure 17:
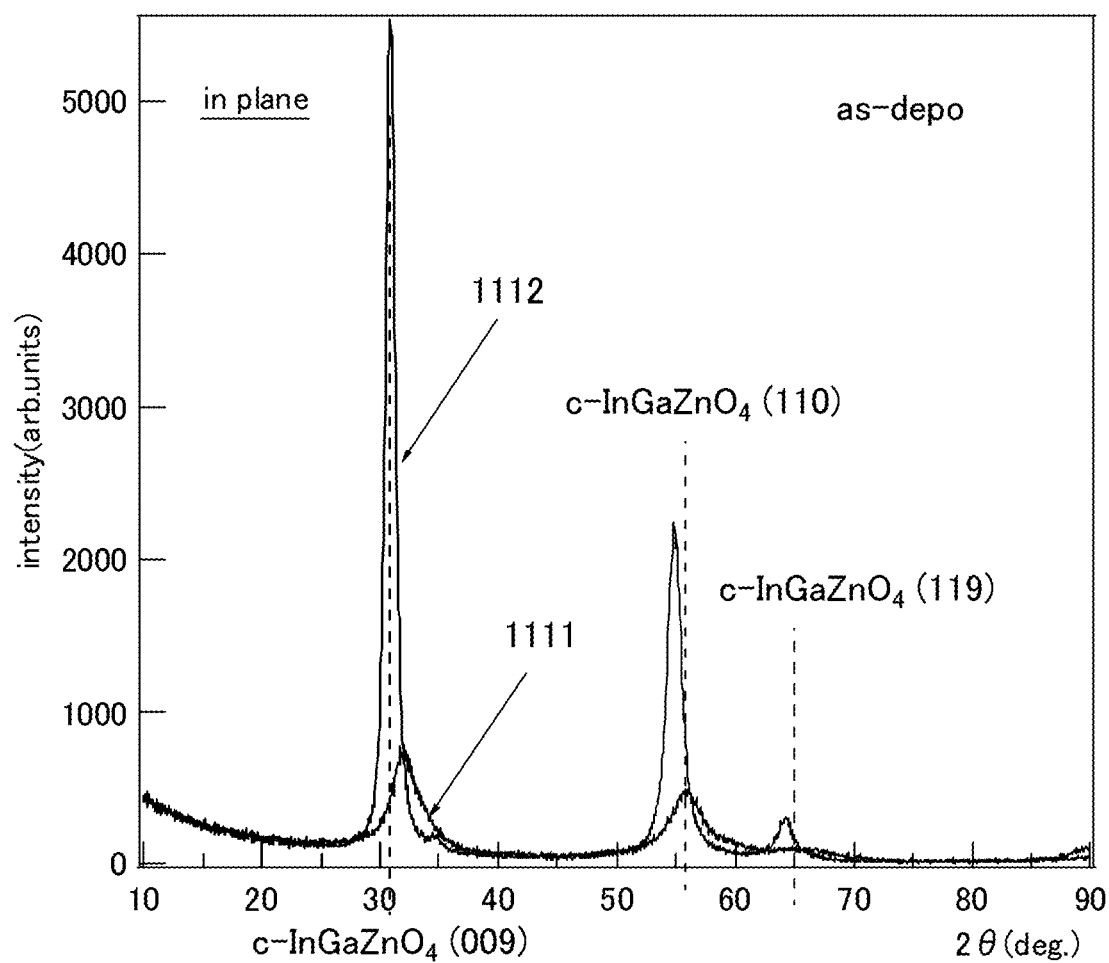
FIG. 17 shows XRD spectra of oxide films including CAAC as deposited (as-depo).
Figure 18:
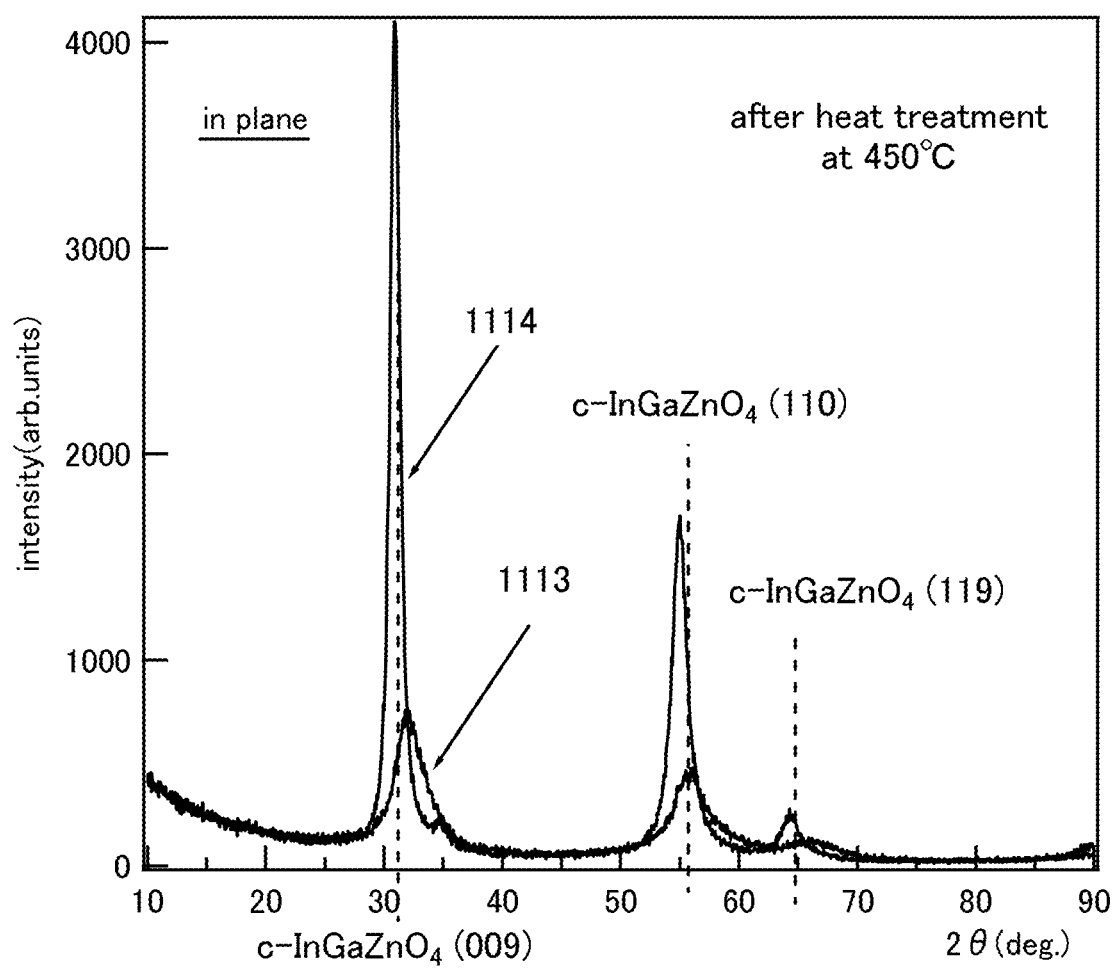
FIG. 18 shows XRD spectra of oxide films including CAAC after heat treatment.

FIG. 17 and FIG. 18 each show XRD spectra obtained by an in-plane method. FIG. 17 shows XRD spectra after deposition (as-depo), and FIG. 18 shows XRD spectra after heat treatment at 450° C. for an hour in an $N_2$ atmosphere, which was performed after deposition. Here, a solid line 1111 and a solid line 1113 each indicate an XRD spectrum of Sample 3, and a solid line 1112 and a solid line 1114 each indicate an XRD spectrum of Sample 4.

From FIG. 17 and FIG. 18, the samples which were formed under both conditions each had a peak at a position corresponding to the (009) plane, which means presence of strong alignment in the c-axis direction. In addition, it was also found that there were a peak at a position corresponding to the (110) plane and a peak at a position corresponding to the (119) plane.

Figure 19:
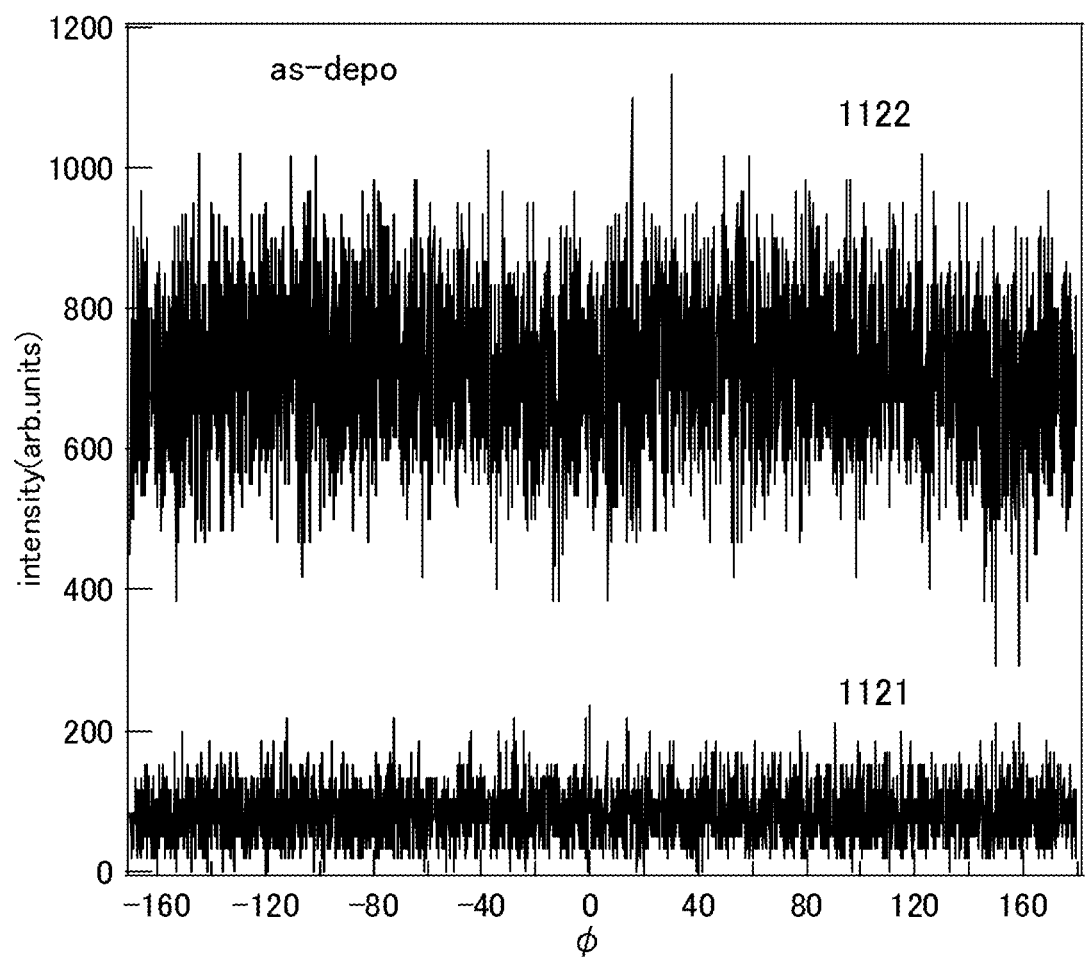
FIG. 19 shows XRD spectra of oxide films including CAAC as deposited (as-depo).
Figure 20:
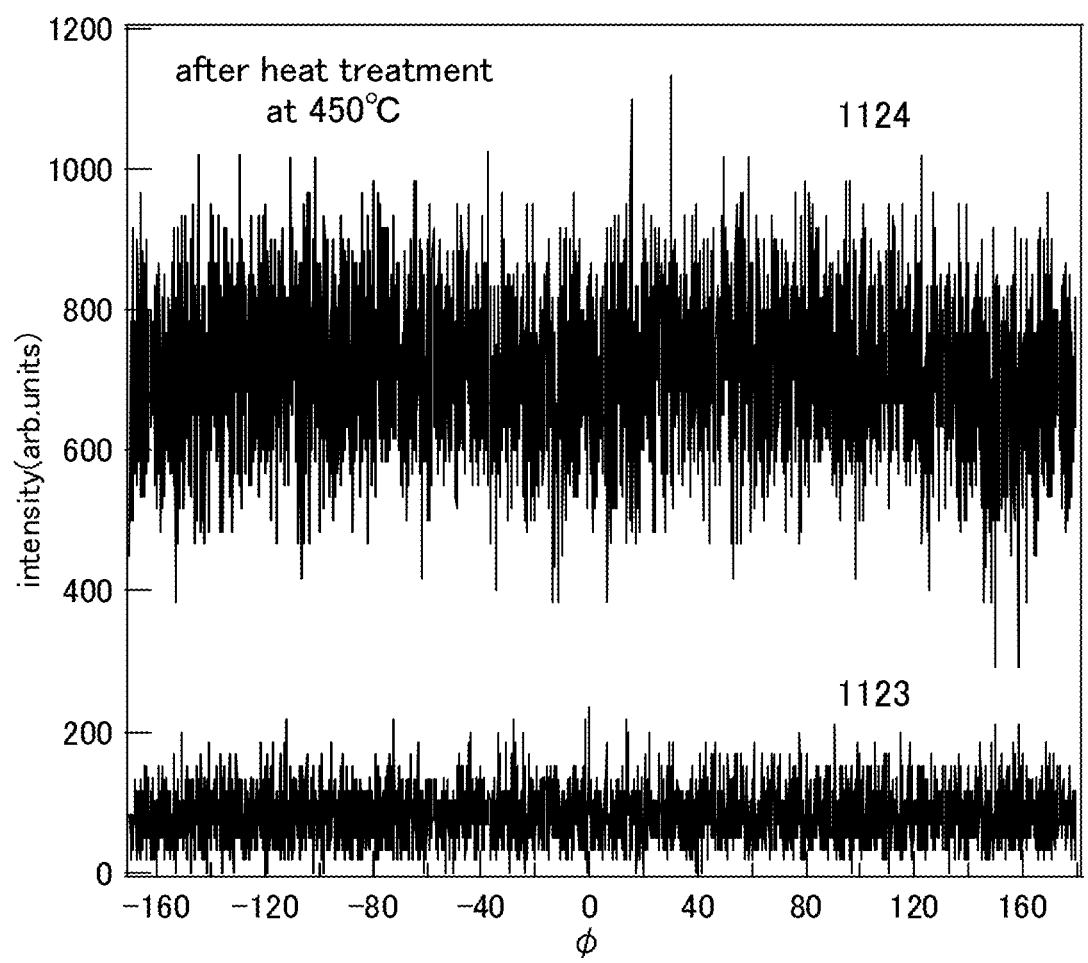
FIG. 20 shows XRD spectra of oxide films including CAAC after heat treatment.

FIG. 19 and FIG. 20 each show XRD spectra measured under conditions where an optical system was fixed to correspond to the peak position (2θ) of the (110) plane obtained by the in-plane method and the samples were rotated around a normal on the sample surface as an axis. Here a solid line 1121 and a solid line 1123 each indicate an XRD spectrum of Sample 3, and a solid line 1122 and a solid line 1124 each indicate an XRD spectrum of Sample 4.

From FIG. 19 and FIG. 20, the samples which were formed under both conditions each had no peak.

According to FIG. 15, FIG. 16, FIG. 17, FIG. 18, FIG. 19, and FIG. 20, it was found that the measured samples had characteristics of CAAC, which is not single crystal and has a different property from polycrystal. Note that although In—Ga—Zn—O-based oxide films are described in this example, a material is not particularly limited thereto. In the case of an In—Sn—Zn—O-based oxide film, an oxide film including CAAC can be obtained.

Example 3

Figure 21:
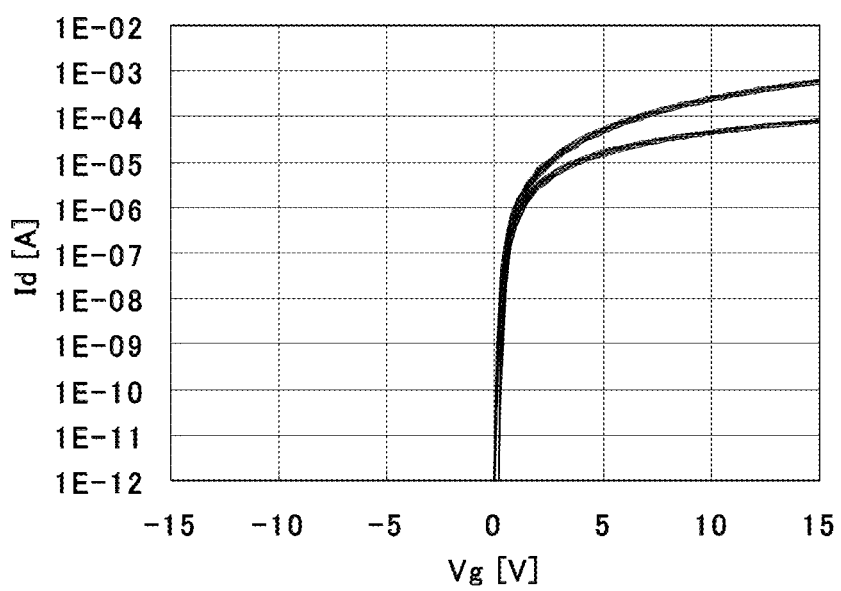
FIG. 21 is a graph showing Vg-Id curves of a transistor.

A transistor was manufactured using an In—Ga—Zn—O-based oxide film (with a thickness of 35 nm) including CAAC over a glass substrate (600 mm×720 mm), and initial characteristics thereof is shown in FIG. 21. The manufactured transistor was a bottom-gate transistor having the structure illustrated in FIGS. 2A to 2C, in which the channel length L was 3 μm and the channel width W was 50 μm. Further, the thickness of a gate insulating film of the transistor was 100 nm.

FIG. 21 shows data on Vg-Id curves (where Vd=1 V, and Vd=10 V) obtained by measurement at 20 points in the substrate. The substantially same values are plotted and overlap, which means that the transistor formed using an In—Ga—Zn—O-based oxide film including CAAC has favorable uniformity. In FIG. 21, the Vg-Id curve on the upper side shows data obtained when Vd=10 V, and the Vg-Id curve on the lower side shows data obtained when Vd=1.

The average value of the threshold voltages Vth measured in the transistor was 1.34 V, and the average value of the field-effect mobilities measured in the transistor was 10.7 $cm^2$/Vs. Note that the threshold voltage Vth is a value calculated by using a curve expressed by the square root of Id in the Vg-Id curve (Vd=10 V) (hereinafter, the curve is also referred to as a √Id curve).

In order to evaluate reliability of the transistor, a plurality of transistors each including an In—Ga—Zn—O-based oxide film (with a thickness of 35 nm) including CAAC were newly manufactured over a 5-inch substrate, and were subjected to BT tests. Each of the manufactured transistors was a bottom-gate transistor having the structure illustrated in FIGS. 2A to 2C, which had a channel length L of 6 μm and a channel width W of 50 μm. In addition, the thickness of a gate insulating film in each transistor was 100 nm.

The BT test is one kind of accelerated test and can evaluate change in characteristics, caused by long-term usage, of transistors in a short time. In particular, the amount of shift in threshold voltage of the transistor between before and after the BT test is an important indicator for examining reliability. As the amount of shift in the threshold voltage Vth (ΔVth) between before and after the BT test is small, the transistor has higher reliability.

Specifically, the temperature of the substrate over which the transistor is formed (substrate temperature) is set at fixed temperature, a source and a drain of the transistor are set at the same potential, and a gate is supplied with potential different from those of the source and the drain for a certain period. The substrate temperature may be determined as appropriate in accordance with the test purpose. A BT test in which a potential applied to a gate is higher than the potential of a source and a drain is referred to as +BT test and a BT test in which a potential applied to a gate is lower than the potential of a source and a drain is referred to as −BT test.

The stress condition of a BT test can be determined in accordance with a substrate temperature, the electric field intensity applied to a gate insulating film, and a time period of application of electric field. The intensity of the electric field applied to the gate insulating film is determined in accordance with a value obtained by dividing a potential difference between the gate and the source and drain by the thickness of the gate insulating film. For example, in the case where the intensity of the electric field applied to the gate insulating film with a thickness of 100 nm is to be 2 MV/cm, the potential difference may be set to 20 V.

Note that a voltage refers to the difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Conditions of the BT tests were as follows: the substrate temperature was 80° C.; the intensity of an electric field applied to the gate insulating film was 3 MV/cm; and the application time (also called stress time) was 100 seconds, 200 seconds, 500 seconds, 1000 seconds, 1500 seconds, and 2000 seconds. Under the above conditions, +BT tests and −BT tests were performed.

Figure 22A:
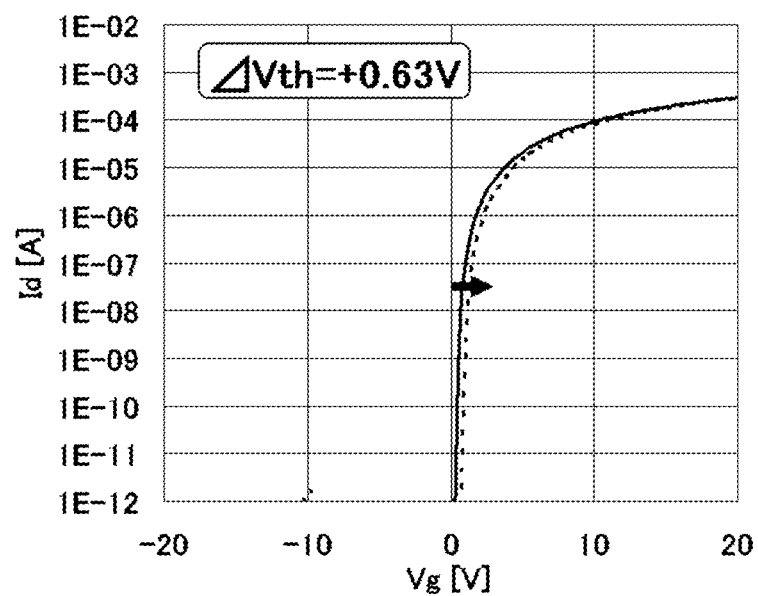
FIGS. 22A and 22B are graphs showing results of a +BT test and a −BT test.
Figure 22B:
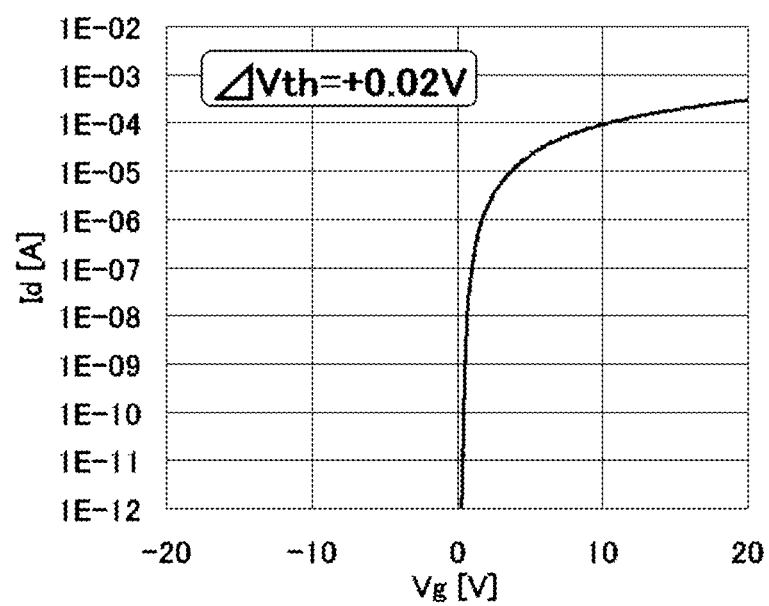

FIG. 22A shows a result of the +BT test performed for 2000 seconds, and FIG. 22B shows a result of the −BT test performed for 2000 seconds.

In FIG. 22A, the threshold voltage Vth after the +BT test was shifted by 0.63 V in the positive direction from the threshold voltage value in the initial characteristics. In FIG. 22B, the threshold voltage Vth after the −BT test was shifted by 0.02 V in the positive direction from the threshold voltage value in the initial characteristics. In both of the BT tests, the amount of shift in the threshold voltage (ΔVth) is less than or equal to 1 V, which proves that the transistor manufactured using an In—Ga—Zn—O-based oxide film including CAAC can have high reliability.

In the BT test, it is important to use a transistor which has been never subjected to a BT test. For example, if a −BT test is performed with use of a transistor which has been once subjected to a +BT test, the results of the −BT test cannot be evaluated correctly due to influence of the +BT test which has been performed previously. Further, the same applies to the case where a +BT test is performed on a transistor which has been once subjected to a +BT test. Note that the same does not apply to the case where a BT test is intentionally repeated in consideration of these influences.

Figure 23A:
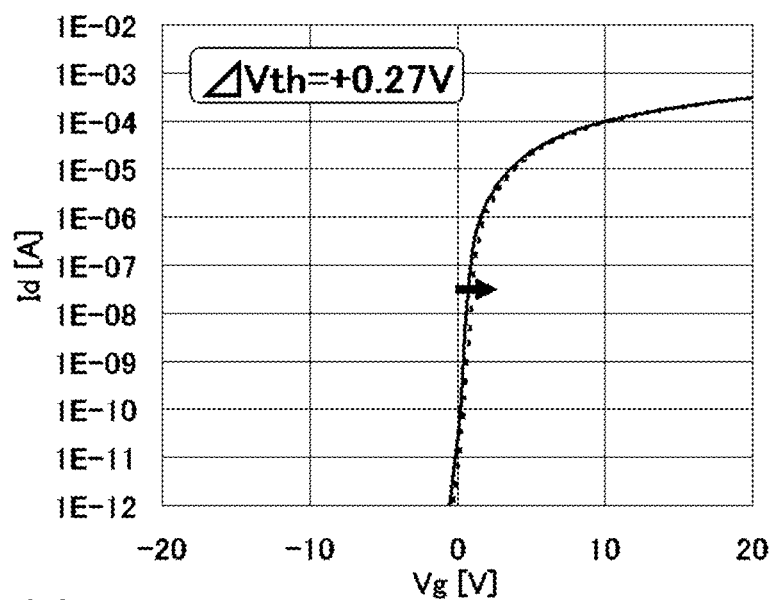
FIGS. 23A and 23B are graphs showing results of a +BT test and a −BT test performed while transistors are irradiated with light.
Figure 23B:
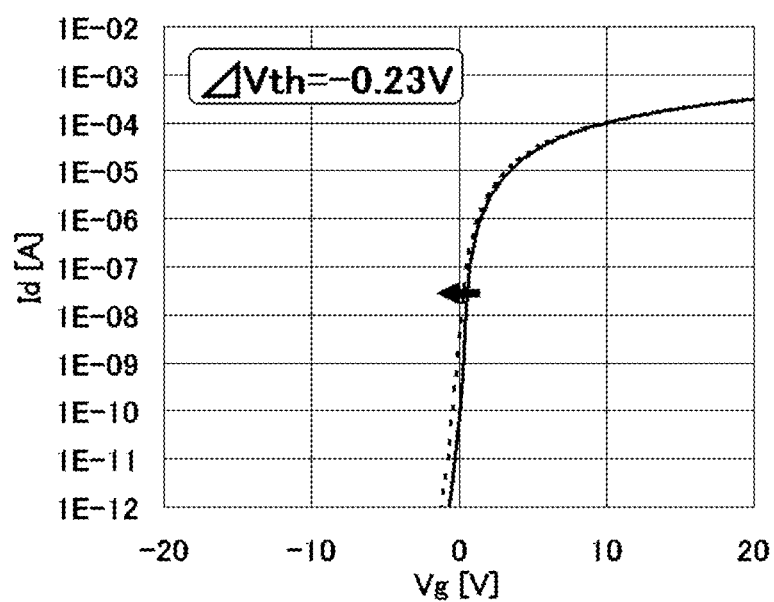

FIG. 23A shows a result of a +BT test performed while a transistor was irradiated with light with use of an LED light source (white light with 10000 lux), which is also called positive-bias temperature stress photodegradation. FIG. 23B shows a result of a −BT test performed while a transistor was irradiated with light with use of an LED light source, which is also called negative-bias temperature stress photodegradation. In FIG. 23A, the threshold voltage Vth after the +BT test is shifted by 0.27 V in the positive direction from the threshold voltage value in the initial characteristics. In FIG. 23B, the threshold voltage Vth after the −BT test is shifted by 0.23 V in the positive direction from the threshold voltage value in the initial characteristics. In both of the BT tests with light irradiation, the amount of shift in the threshold voltage (ΔVth) is less than or equal to 1 V, which proves that the transistor manufactured using an In—Ga—Zn—O-based oxide film including CAAC can have high reliability.

Figure 24:
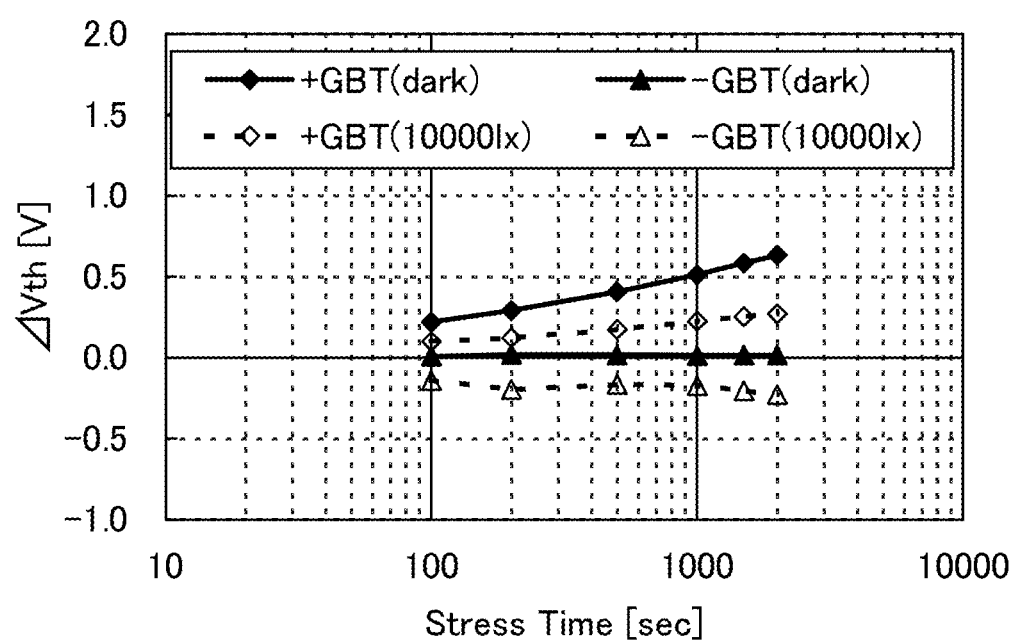
FIG. 24 is a graph showing time dependence of the amount of shift in the threshold voltage Vth (ΔVth) on various kinds of stress conditions.

FIG. 24 shows time dependence of the amount of shift in the threshold voltage Vth (ΔVth) on various kinds of stress conditions. The vertical axis represents the amount of shift in the threshold voltage Vth (ΔVth) on a linear scale, and the horizontal axis represents the stress time on a logarithmic scale.

Figure 25A:
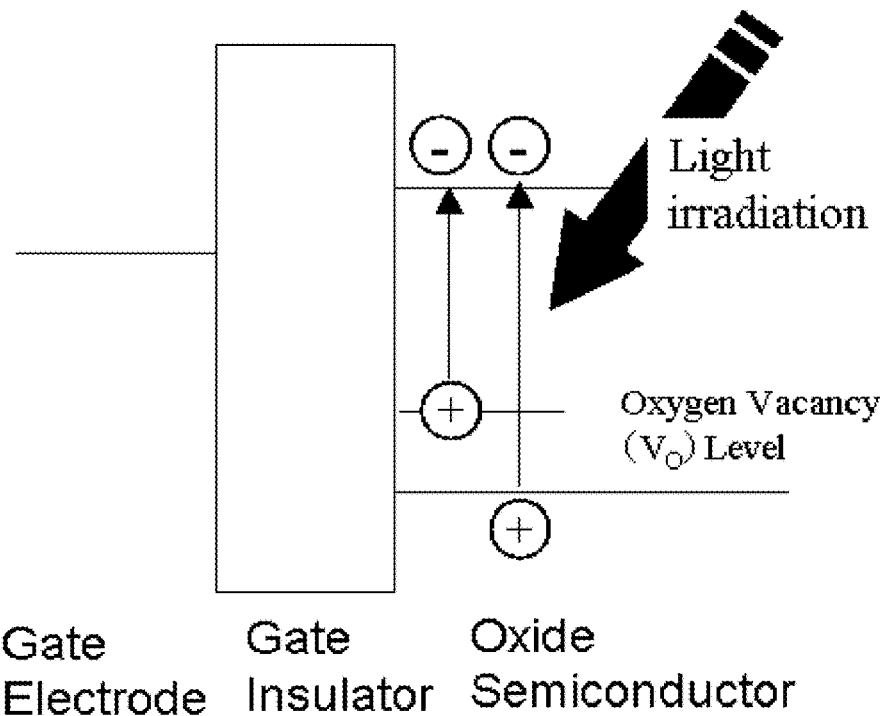
FIGS. 25A and 25B are schematic diagrams showing mechanism of negative-bias temperature stress photodegradation.
Figure 25B:
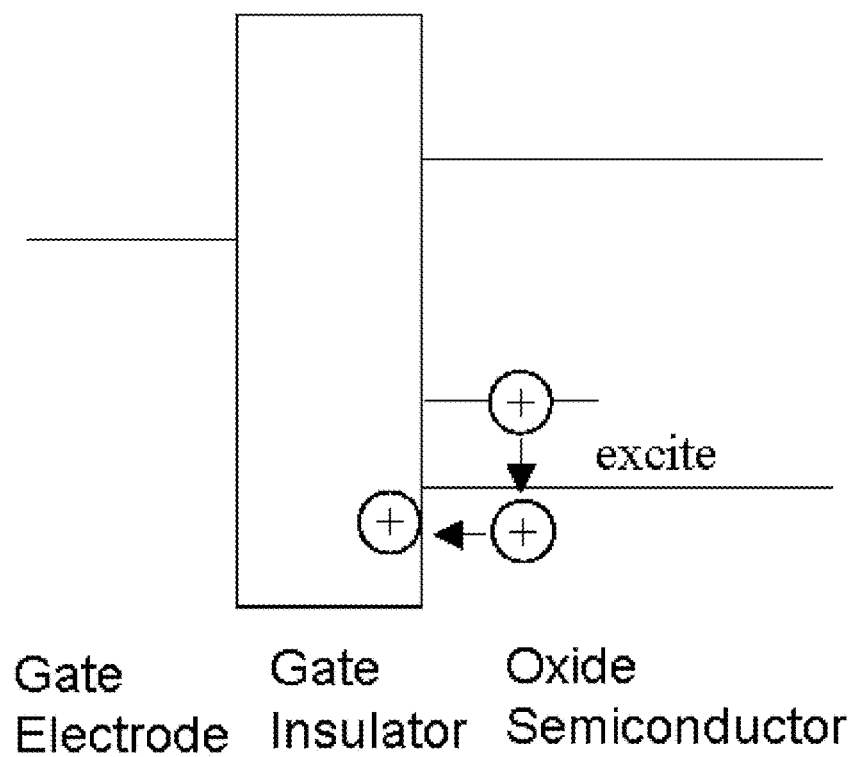

FIGS. 25A and 25B are schematic diagrams showing mechanism of negative-bias stress temperature photodegradation. FIGS. 25A and 25B each illustrate an interface between an oxide semiconductor and a gate insulating film. As illustrated in FIG. 25A, when a transistor is irradiated with light, a hole is generated. The hole is trapped or detrapped. As illustrated in FIG. 25B, the hole is drawn to the gate insulating film and thereby becoming fixed charge which causes a shift of the threshold voltage Vth in the negative direction. Thus, no oxygen vacancy level is important for elimination of negative-bias temperature stress photodegradation. That is, a reduction in oxygen vacancy is effective for prevention of negative-bias temperature stress photodegradation. A crystalline surface is less likely than an amorphous surface to transmit oxygen; thus, a transistor including an In—Ga—Zn—O-based oxide film including CAAC has high reliability. In addition, in order to reduce oxygen vacancy, a film from which oxygen is released by heating is used as a gate insulating film and an interlayer insulating film, and heat treatment is performed in an oxygen atmosphere, which are effective for improving reliability.

EXPLANATION OF REFERENCE

100: substrate, 102: base insulating film, 104: gate electrode, 106: semiconductor film, 112: gate insulating film, 116: electrode, 118: interlayer insulating film, 121: region, 126: region, 200: pixel, 210: liquid crystal element, 220: capacitor, 230: transistor, 300: housing, 301: button, 302: microphone, 303: display portion, 304: speaker, 305: camera, 310: housing, 311: display portion, 320: housing, 321: button, 322: microphone, 323: display portion, 1001: region, 1002: region, 1101: solid line, 1102: solid line, 1103: solid line, 1104: solid line, 1111: solid line, 1112: solid line, 1113: solid line, 1114: solid line, 1121: solid line, 1122: solid line, 1123: solid line, 1124: solid line This application is based on Japanese Patent Application serial no. 2010-282135 filed with Japan Patent Office on Dec. 17, 2010 and Japanese Patent Application serial no. 2011-151859 filed with Japan Patent Office on Jul. 8, 2011, the entire contents of which are hereby incorporated by reference.

The invention claimed is:

1. A semiconductor device comprising:
   an oxide semiconductor layer comprising:
      a first layer comprising In, Ga and Zn; and
      a second layer over the first layer, the second layer comprising In, Ga and Zn; and
   an insulating layer over and in contact with the second layer,
   wherein the second layer comprises c-axis aligned crystals, and
   wherein the c-axis aligned crystals have different a-axis and b-axis from each other.

2. The semiconductor device according to claim 1, wherein the first layer and the second layer have a different composition from each other.

3. The semiconductor device according to claim 1, further comprising a gate electrode,
   wherein the oxide semiconductor layer and the gate electrode overlap each other.

4. The semiconductor device according to claim 1, wherein the second layer comprises an In—Ga—Zn—O based material.

5. The semiconductor device according to claim 1, further comprising a source electrode and a drain electrode being in contact with the oxide semiconductor layer,
wherein each of the source electrode and the drain electrode has a stacked-layer structure comprising a first electrode film and a second electrode film,
wherein the first electrode film comprises Cu, and
wherein the second electrode film comprises one of Ti, Mo, Mn and Al.

6. The semiconductor device according to claim 1, further comprising a display element,
wherein the display element is electrically connected to the oxide semiconductor layer.

7. A semiconductor device comprising:
a gate electrode;
a gate insulating layer over the gate electrode;
an oxide semiconductor layer over the gate insulating layer, the oxide semiconductor layer comprising:
a first layer comprising In, Ga and Zn; and
a second layer over the first layer, the second layer comprising In, Ga and Zn; and
a source electrode and a drain electrode each in contact with the oxide semiconductor layer,
wherein the first layer and the second layer have a different composition from each other,
wherein the second layer comprises c-axis aligned crystals, and
wherein the c-axis aligned crystals have different a-axis and b-axis from each other.

8. The semiconductor device according to claim 7, wherein the second layer comprises an In—Ga—Zn—O based material.

9. The semiconductor device according to claim 7,
wherein each of the source electrode and the drain electrode has a stacked-layer structure comprising a first electrode film and a second electrode film,
wherein the first electrode film comprises Cu, and
wherein the second electrode film comprises one of Ti, Mo, Mn and Al.

10. The semiconductor device according to claim 7, further comprising a display element,
wherein the display element is electrically connected to one of the source electrode and the drain electrode.

* * * * *